(12) United States Patent
Watanabe et al.

(10) Patent No.: US 10,976,383 B2
(45) Date of Patent: Apr. 13, 2021

(54) MAGNETIC SENSOR DEVICE

(71) Applicants: TDK CORPORATION, Tokyo (JP); ASAHI KASEI MICRODEVICES CORPORATION, Tokyo (JP)

(72) Inventors: Kazuya Watanabe, Tokyo (JP); Yoshitaka Okutsu, Tokyo (JP); Masanori Yoshida, Tokyo (JP)

(73) Assignees: TDK CORPORATION, Tokyo (JP); ASAHI KASEI MICRODEVICES CORPORATION, Tokyo (JP)

( * ) Notice: Subject to any disclaimer, the term of this patent is extended or adjusted under 35 U.S.C. 154(b) by 65 days.

(21) Appl. No.: 16/587,299

(22) Filed: Sep. 30, 2019

(65) Prior Publication Data
US 2020/0116801 A1    Apr. 16, 2020

(30) Foreign Application Priority Data

Oct. 11, 2018    (JP) .............................. JP2018-192240

(51) Int. Cl.
*G01R 33/02*    (2006.01)
*G01R 33/07*    (2006.01)
*G01R 33/09*    (2006.01)
*G01R 33/00*    (2006.01)

(52) U.S. Cl.
CPC ......... *G01R 33/0206* (2013.01); *G01R 33/07* (2013.01); *G01R 33/098* (2013.01); *G01R 33/0017* (2013.01)

(58) Field of Classification Search
CPC ... G01R 33/07; G01R 33/098; G01R 33/0017
See application file for complete search history.

(56) References Cited

U.S. PATENT DOCUMENTS

| | | | |
|---|---|---|---|
| 9,116,195 B2 * | 8/2015 | Yamashita | G01R 35/005 |
| 2010/0117638 A1 * | 5/2010 | Yamashita | G01R 35/005 |
| | | | 324/233 |
| 2011/0178751 A1 * | 7/2011 | Mori | G01R 35/005 |
| | | | 702/85 |
| 2012/0095712 A1 * | 4/2012 | Komasaki | G01D 3/036 |
| | | | 702/94 |

FOREIGN PATENT DOCUMENTS

JP    2015-075465 A    4/2015

* cited by examiner

*Primary Examiner* — Alvaro E Fortich
(74) *Attorney, Agent, or Firm* — Oliff PLC

(57) ABSTRACT

A magnetic sensor device includes three magnetic sensors for detecting components of an external magnetic field that are in three directions, a magnetic field generation section, and a correction processor. The magnetic field generation section generates additional magnetic field components in three directions used for measurements of main- and cross-axis sensitivities of the three magnetic sensors. The correction processor corrects respective detection signals of the three magnetic sensors on the basis of the measurement results of the main- and cross-axis sensitivities of the magnetic sensors.

6 Claims, 14 Drawing Sheets

MAGNETIC SENSOR DEVICE

BACKGROUND OF THE INVENTION

1. Field of the Invention

The present invention relates to a magnetic sensor device including a plurality of magnetic sensors for detecting components of an external magnetic field that are in a plurality of directions.

2. Description of the Related Art

Magnetic sensors for detecting a component in a predetermined direction of an external magnetic field have recently been used in a variety of applications. Hereinafter, a component of an external magnetic field will be referred to as an external magnetic field component. A type of magnetic sensor is known that incorporates at least one magnetic detection element provided on a substrate. An example of the magnetic detection element is a magnetoresistive element.

The magnetic sensor for detecting an external magnetic field component in a predetermined direction is configured to generate a detection signal corresponding to the external magnetic field component in the predetermined direction. The predetermined direction will hereinafter be referred to as a main-axis direction. For example, the main-axis direction coincides with a sensing direction of the magnetic sensor. The ratio of a change in the detection signal of the magnetic sensor to a change in the strength of a magnetic field in the main-axis direction will be referred to as a main-axis sensitivity of the magnetic sensor.

The main-axis sensitivity can vary due to individual differences of magnetic sensors. In a device including a plurality of magnetic sensors for detecting external magnetic field components in a plurality of directions, the respective main-axis sensitivities of the magnetic sensors may be different from each other. The main-axis sensitivity can also vary depending on the environment of use of the magnetic sensor. A device including a magnetic sensor is therefore desirably capable of measuring the main-axis sensitivity of the magnetic sensor and correcting the detection signal of the magnetic sensor on the basis of the measurement results according to need.

U.S. Pat. No. 9,116,195 B2 discloses a magnetic sensor including a semiconductor substrate provided with a plurality of magnetosensitive elements spaced from each other, and a magnetic substance provided on the semiconductor substrate. The plurality of magnetosensitive elements are placed at edge areas of the magnetic substance. The magnetic sensor detects magnetic-field strengths for three mutually orthogonal axes on the basis of outputs of the plurality of magnetosensitive elements. In this magnetic sensor, each magnetosensitive element has magnetic sensitivity in the vertical direction. This magnetic sensor includes a horizontal magnetic field generating coil for sensitivity measurement, and a plurality of vertical magnetic field generating coils for sensitivity measurement. The horizontal magnetic field generating coil generates a horizontal magnetic field component. The horizontal magnetic field component causes vertical magnetic field components to occur near the edge of the magnetic substance, and the plurality of magnetosensitive elements detect those vertical magnetic field components to thereby detect the horizontal magnetic field component. The plurality of vertical magnetic field generating coils are provided near the plurality of magnetosensitive elements and generate vertical magnetic field components. The plurality of magnetosensitive elements respectively detect the vertical magnetic field components generated by the plurality of vertical magnetic field generating coils.

The magnetic sensor disclosed in U.S. Pat. No. 9,116,195 B2 is capable of measuring main-axis sensitivities for the three axes.

In a device including a plurality of magnetic sensors for detecting external magnetic field components in a plurality of directions, the detection signal of each magnetic sensor can change in response to a change in the strength of a magnetic field in a direction other than the main-axis direction. The ratio of a change in the detection signal of the magnetic sensor to a change in the strength of the magnetic field in a direction other than the main-axis direction will be referred to as a cross-axis sensitivity.

The device including a plurality of magnetic sensors is therefore desirably capable of measuring not only the main-axis sensitivity but also the cross-axis sensitivities of each magnetic sensor and correcting the detection signals of the plurality of magnetic sensors on the basis of the measurement results according to need.

JP 2015-075465A describes a three-dimensional magnetic field measurement device including a magnetic body, first to fourth magnetic detection elements arranged near the magnetic body, a signal processing unit, a correction-coefficient storage unit, and a magnetic-field-component calculation unit. Based on the output signals of the first to fourth magnetic detection elements, the signal processing unit generates output signals corresponding to three-dimensional magnetic field vectors input to the magnetic body. The correction-coefficient storage unit stores correction coefficients for correcting cross-axis sensitivity components contained in the output signals of the signal processing unit. The magnetic-field-component calculation unit generates three-dimensional output signals based on the output signals of the signal processing unit and the correction coefficients.

JP 2015-075465A further describes a technique of inputting three linearly independent magnetic field vectors to the three-dimensional magnetic field measurement device, and generating the correction coefficients with a correction-coefficient generation device on the basis of signals including cross-axis sensitivities that are generated by the three-dimensional magnetic field measurement device in response to the aforementioned input.

According to the technique described in JP 2015-075465A, to measure the cross-axis sensitivities of the three-dimensional magnetic field measurement device and generate the correction coefficients, three linearly independent magnetic field vectors need to be input to the three-dimensional magnetic field measurement device from outside the three-dimensional magnetic field measurement device. However, the technique has a drawback that after shipment of the three-dimensional magnetic field measurement device, inputting the three linearly independent magnetic field vectors to the three-dimensional magnetic field measurement device from outside the three-dimensional magnetic field measurement device may be difficult depending on the environment of use of the three-dimensional magnetic field measurement device.

SUMMARY OF THE INVENTION

It is an object of the present invention to provide a magnetic sensor device that includes a plurality of magnetic sensors and is capable of easily measuring the main- and cross-axis sensitivities of each magnetic sensor and correcting a detection signal of each magnetic sensor on the basis of the measurement results regardless of the environment of use of the magnetic sensor device.

A magnetic sensor device according to a first aspect of the present invention includes: a first magnetic sensor for generating a first detection signal having a correspondence with a first external magnetic field component, the first external magnetic field component being a component of an external magnetic field and being in a first sensing direction; a second magnetic sensor for generating a second detection signal having a correspondence with a second external magnetic field component, the second external magnetic field component being a component of the external magnetic field and being in a second sensing direction; a third magnetic sensor for generating a third detection signal having a correspondence with a third external magnetic field component, the third external magnetic field component being a component of the external magnetic field and being in a third sensing direction; a first magnetic field generator capable of generating a first additional magnetic field; a second magnetic field generator capable of generating a second additional magnetic field; a third magnetic field generator capable of generating a third additional magnetic field; and a correction processor for controlling the first to third magnetic field generators and correcting the first to third detection signals.

The first to third magnetic sensors and the first to third magnetic field generators are integrated. The first to third magnetic sensors are each configured to be subjected to: a first additional magnetic field component when the first additional magnetic field is generated by the first magnetic field generator; a second additional magnetic field component when the second additional magnetic field is generated by the second magnetic field generator; and a third additional magnetic field component when the third additional magnetic field is generated by the third magnetic field generator. The first additional magnetic field component is a component of the first additional magnetic field and is in a direction parallel to a first direction. The second additional magnetic field component is a component of the second additional magnetic field and is in a direction parallel to a second direction. The third additional magnetic field component is a component of the third additional magnetic field and is in a direction parallel to a third direction.

The correction processor performs correction function determination processing to determine correction functions for correcting the first to third detection signals, and correction processing to correct the first to third detection signals by using the first to third detection signals and the correction functions. The correction function determination processing is processing to obtain: first to third data concerning respective changes in the first to third detection signals when the first magnetic field generator is controlled to change the first additional magnetic field; fourth to sixth data concerning respective changes in the first to third detection signals when the second magnetic field generator is controlled to change the second additional magnetic field; and seventh to ninth data concerning respective changes in the first to third detection signals when the third magnetic field generator is controlled to change the third additional magnetic field, and to determine the correction functions on the basis of the first to ninth data.

In the magnetic sensor device according to the first aspect of the invention, the first to third directions may be orthogonal to each other.

In the magnetic sensor device according to the first aspect of the invention, the correction processor may be integrated with the first to third magnetic sensors and the first to third magnetic field generators.

A magnetic sensor device according to a second aspect of the present invention includes: a first magnetic sensor for generating a first detection signal having a correspondence with a first external magnetic field component, the first external magnetic field component being a component of an external magnetic field and being in a first sensing direction; a second magnetic sensor for generating a second detection signal having a correspondence with a second external magnetic field component, the second external magnetic field component being a component of the external magnetic field and being in a second sensing direction; a first magnetic field generator capable of generating a first additional magnetic field; a second magnetic field generator capable of generating a second additional magnetic field; and a correction processor for controlling the first and second magnetic field generators and correcting the first and second detection signals.

The first and second magnetic sensors and the first and second magnetic field generators are integrated. The first and second magnetic sensors are each configured to be subjected to: a first additional magnetic field component when the first additional magnetic field is generated by the first magnetic field generator; and a second additional magnetic field component when the second additional magnetic field is generated by the second magnetic field generator. The first additional magnetic field component is a component of the first additional magnetic field and is in a direction parallel to a first direction. The second additional magnetic field component is a component of the second additional magnetic field and is in a direction parallel to a second direction.

The correction processor performs correction function determination processing to determine correction functions for correcting the first and second detection signals, and correction processing to correct the first and second detection signals by using the first and second detection signals and the correction functions. The correction function determination processing is processing to obtain: first and second data concerning respective changes in the first and second detection signals when the first magnetic field generator is controlled to change the first additional magnetic field; and third and fourth data concerning respective changes in the first and second detection signals when the second magnetic field generator is controlled to change the second additional magnetic field, and to determine the correction functions on the basis of the first to fourth data.

In the magnetic sensor device according to the second aspect of the invention, the first and second directions may be orthogonal to each other.

In the magnetic sensor device according to the second aspect of the invention, the correction processor may be integrated with the first and second magnetic sensors and the first and second magnetic field generators.

In the magnetic sensor device according to the first aspect of the invention, the first to third magnetic sensors and the first to third magnetic field generators are integrated. By virtue of this, with the magnetic sensor device according to the first aspect of the invention, it is possible to perform measurements of the main- and cross-axis sensitivities of the first to third magnetic sensors and to correct the first to third detection signals on the basis of the measurement results easily regardless of the environment of use of the magnetic sensor device.

In the magnetic sensor device according to the second aspect of the invention, the first and second magnetic sensors and the first and second magnetic field generators are integrated. By virtue of this, with the magnetic sensor device according to the second aspect of the invention, it is possible to perform measurements of the main- and cross-axis sensitivities of the first and second magnetic sensors and to correct the first and second detection signals on the basis of the measurement results easily regardless of the environment of use of the magnetic sensor device.

Other and further objects, features and advantages of the present invention will appear more fully from the following description.

DETAILED DESCRIPTION OF THE PREFERRED EMBODIMENTS

First Embodiment

Preferred embodiments of the present invention will now be described in detail with reference to the drawings. First, reference is made to FIG. 1 to describe a schematic configuration of a magnetic sensor device according to a first embodiment of the invention. The magnetic sensor device 1 according to the present embodiment is a device for detecting components of an external magnetic field that are in three mutually orthogonal directions. For example, the magnetic sensor device 1 is incorporated in an electronic apparatus such as an information apparatus and used as a geomagnetic sensor device.

Figure 1:
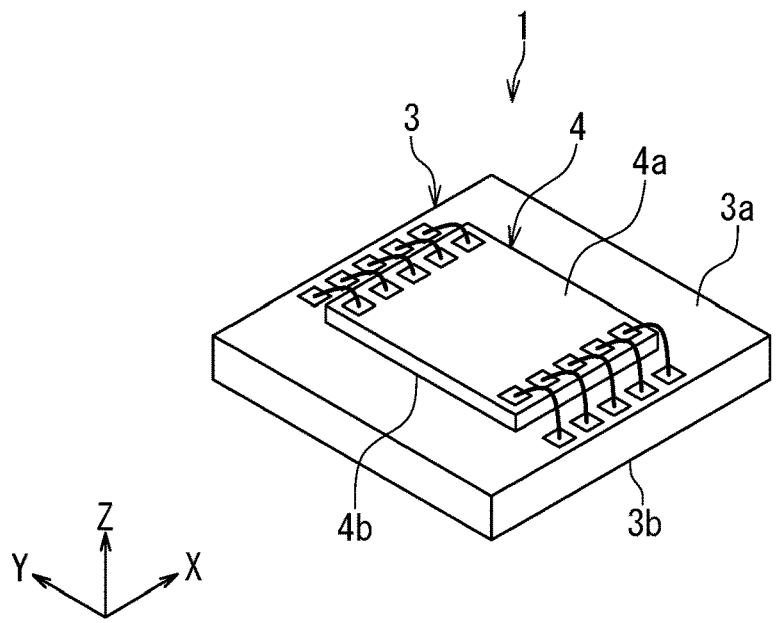
FIG. 1 is a perspective view of a magnetic sensor device according to a first embodiment of the invention.

As shown in FIG. 1, the magnetic sensor device 1 includes a circuit chip 3 and a sensor chip 4. Both the circuit chip 3 and the sensor chip 4 have a rectangular parallelepiped shape. The circuit chip 3 and the sensor chip 4 have their respective outer surfaces.

The outer surfaces of the circuit chip 3 include a top surface 3a and a bottom surface 3b opposite to each other, and four side surfaces connecting the top surface 3a and the bottom surface 3b. The outer surfaces of the sensor chip 4 include a top surface 4a and a bottom surface 4b opposite to each other, and four side surfaces connecting the top surface 4a and the bottom surface 4b. The sensor chip 4 is mounted on the top surface 3a of the circuit chip 3 in such an orientation that the bottom surface 4b faces the top surface 3a.

The circuit chip 3 has a group of terminals provided on the top surface 3a. The sensor chip 4 has a group of terminals provided on the top surface 4a. The group of terminals of the sensor chip 4 is connected to the group of terminals of the circuit chip 3 via bonding wires, for example.

Figure 2:
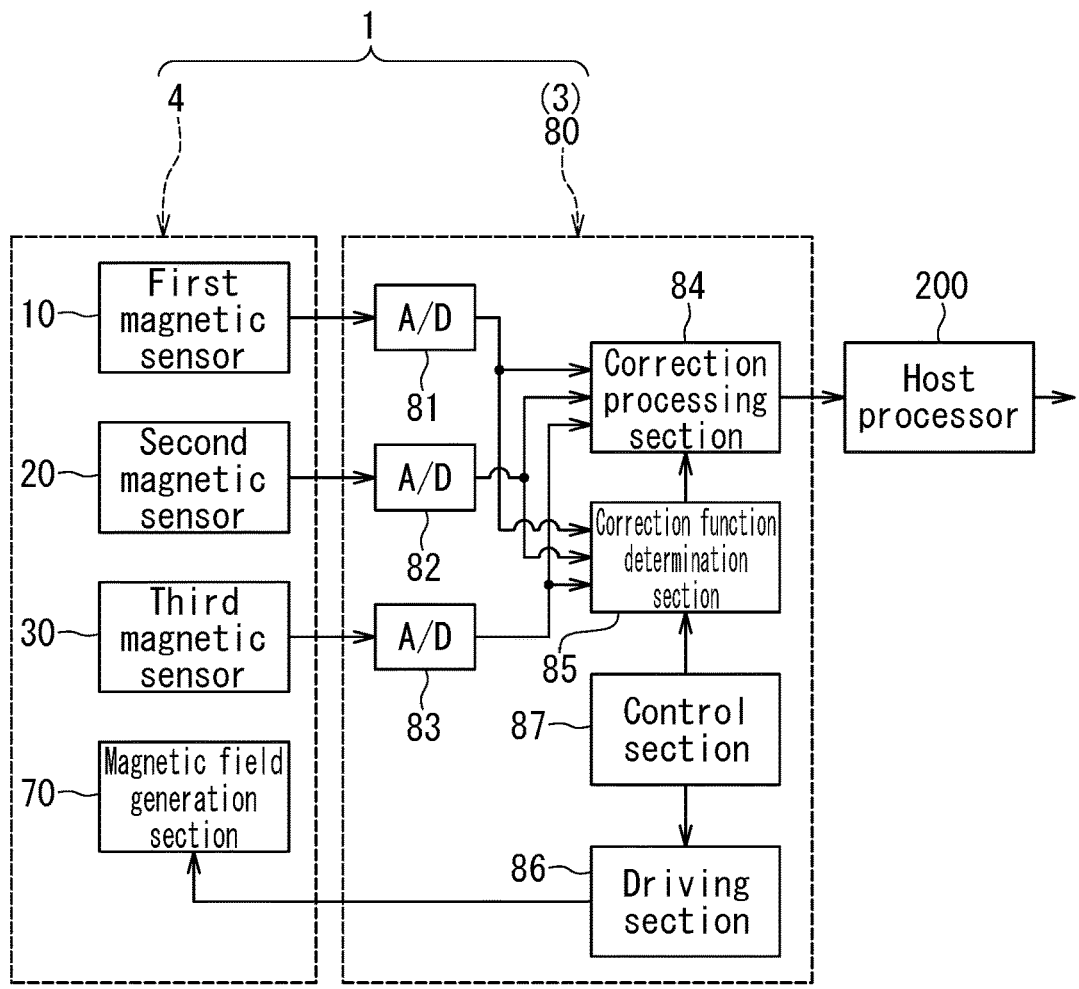
FIG. 2 is a functional block diagram showing a configuration of the magnetic sensor device according to the first embodiment of the invention.

FIG. 2 is a functional block diagram showing the configuration of the magnetic sensor device 1. As shown in FIG. 2, the sensor chip 4 includes a first magnetic sensor 10, a second magnetic sensor 20, and a third magnetic sensor 30.

The first magnetic sensor 10 generates a first detection signal having a correspondence with a first external magnetic field component. The first external magnetic field component is a component of an external magnetic field and is in a first sensing direction. The second magnetic sensor 20 generates a second detection signal having a correspondence with a second external magnetic field component. The second external magnetic field component is a component of the external magnetic field and is in a second sensing direction. The third magnetic sensor 30 generates a third detection signal having a correspondence with a third external magnetic field component. The third external magnetic field component is a component of the external magnetic field and is in a third sensing direction.

The magnetic sensor device 1 further includes a magnetic field generation section 70. The magnetic field generation section 70 may be included in either the circuit chip 3 or the sensor chip 4. An example where the magnetic field generation section 70 is included in the sensor chip 4 will be described below. The magnetic field generation section 70 includes first to third magnetic field generators capable of generating first to third additional magnetic fields, respectively. The first to third magnetic field generators will be described in detail later.

The circuit chip 3 includes a correction processor 80 for controlling the magnetic field generation section 70 and correcting the first to third detection signals. The correction processor 80 is constructed of an application-specific integrated circuit (ASIC), for example.

The correction processor 80 includes analog-to-digital converters (hereinafter, "A/D converters") 81, 82 and 83, a correction processing section 84, a correction function determination section 85, a driving section 86, and a control section 87. The A/D converters 81, 82 and 83 convert the first, second and third detection signals into digital form, respectively. The correction processing section 84, the correction function determination section 85, the driving section 86, and the control section 87 are functional blocks for performing processing described below.

The correction function determination section 85 performs, in cooperation with the control section 87 and the driving section 86, correction function determination processing to determine correction functions for correcting the first to third detection signals. The control section 87 controls the correction function determination section 85 and the driving section 86 so that the correction function determination processing is performed. The driving section 86 controls the magnetic field generation section 70 to generate the first to third additional magnetic fields and to change the first to third additional magnetic fields. The correction function determination section 85 determines the correction functions on the basis of data concerning respective changes in the first to third detection signals when the first to third additional magnetic fields are changed.

The correction processing section 84 performs correction processing to correct the first to third detection signals to generate first to third corrected signals by using the first to third detection signals and the correction functions. The correction processing section 84 outputs the first to third corrected signals to a host processor 200 of the electronic apparatus incorporating the magnetic sensor device 1. The configuration of the host processor 200 will be described later.

Figure 3:
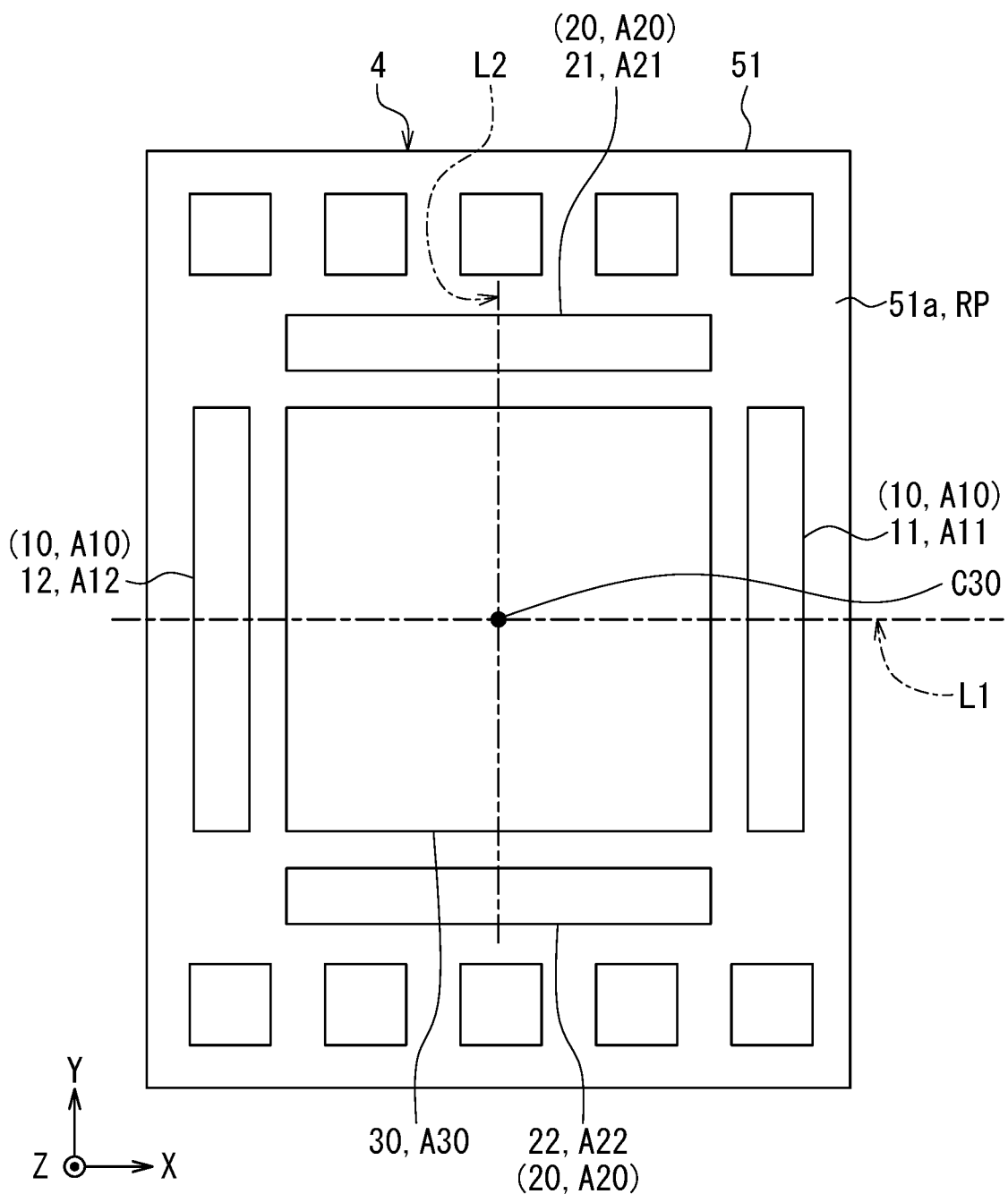
FIG. 3 is a plan view of a sensor chip of the first embodiment of the invention.
Figure 9:
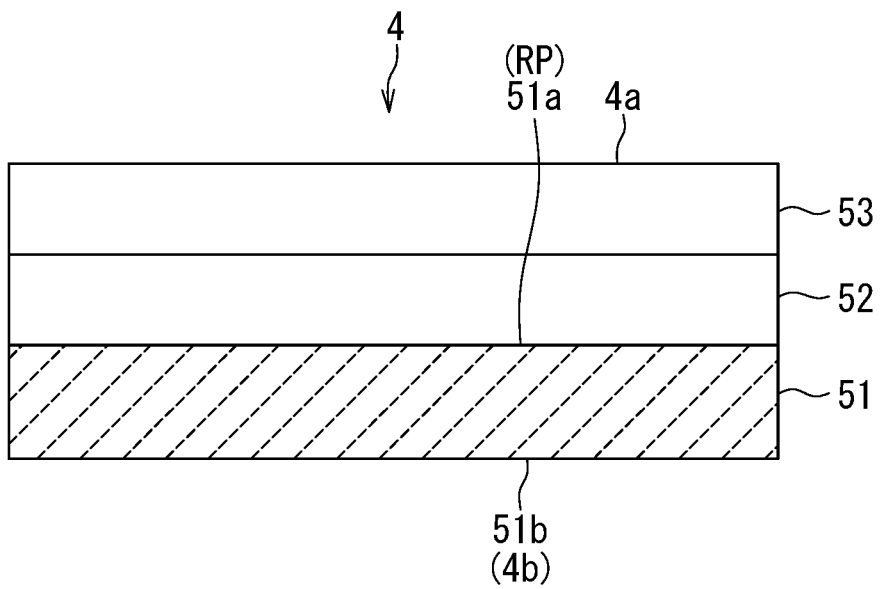
FIG. 9 is a cross-sectional view of the sensor chip of the first embodiment of the invention.

The layout of the first to third magnetic sensors 10, 20 and 30 will now be described with reference to FIG. 3. FIG. 3 is a plan view of the sensor chip 4. As shown in FIG. 3, the sensor chip 4 includes the aforementioned first to third magnetic sensors 10, 20 and 30, and a substrate 51 supporting the first to third magnetic sensors 10, 20 and 30. The substrate 51 has a top surface 51a and a bottom surface 51b. The bottom surface 51b is shown in FIG. 9 to be described later.

Now, a description will be given of a reference coordinate system and first to third sensor coordinate systems of the present embodiment. The reference coordinate system is a coordinate system that is set with reference to a reference plane RP. The directions of the first to third additional magnetic fields generated by the magnetic field generation section 70 are expressed in the reference coordinate system. If the magnetic field generation section 70 is included in the sensor chip 4 as described above, the top surface 51a of the substrate 51 is assumed to be the reference plane RP, for example. If the magnetic field generation section 70 is included in the circuit chip 3, the top surface 3a of the circuit chip 3 is assumed to be the reference plane RP, for example.

The first to third sensor coordinate systems are coordinate systems that are set with reference to the first to third magnetic sensors 10, 20, and 30, respectively. The first to third sensor coordinate systems will hereinafter be simply referred to as a sensor coordinate system, as a generic term. An X direction, a Y direction, and a Z direction are defined in both of the reference coordinate system and the sensor coordinate system.

The X, Y, and Z directions of the reference coordinate system are orthogonal to each other. The Z direction of the reference coordinate system is a direction perpendicular to the reference plane RP, and directed from the bottom surface 51b to the top surface 51a of the substrate 51. The X and Y directions of the reference coordinate system are directions parallel to the reference plane RP.

The magnetic sensor device 1 is designed so that the first to third sensor coordinate systems coincide with the reference coordinate system. However, at least one of the first to third sensor coordinate systems can deviate from the reference coordinate system due to reasons such as misalignment of the first to third magnetic sensors 10, 20, and 30 with the substrate 51.

For both of the reference coordinate system and the sensor coordinate system, the opposite direction to the X direction is defined as the −X direction, the opposite direction to the Y direction as the −Y direction, and the opposite direction to the Z direction as the −Z direction. Hereinafter, the term "above" refers to positions located forward of a reference position in the Z direction, and "below" refers to positions opposite from the "above" positions with respect to the reference position. For each component of the magnetic sensor device 1, the term "top surface" refers to a surface of the component lying at the end thereof in the Z direction, and "bottom surface" refers to a surface of the component lying at the end thereof in the −Z direction.

Hereinafter, unless otherwise specified, the X, Y, and Z directions shown in the drawings shall apply to both of the reference coordinate system and the sensor coordinate system.

The reference plane RP includes three different areas: a first area A10; a second area A20; and a third area A30. The first area A10 is an area formed by vertically projecting the first magnetic sensor 10 onto the reference plane RP. The second area A20 is an area formed by vertically projecting the second magnetic sensor 20 onto the reference plane RP. The third area A30 is an area formed by vertically projecting the third magnetic sensor 30 onto the reference plane RP.

Here, two mutually orthogonal straight lines that are located in the reference plane RP, pass through the centroid C30 of the third area A30 and are perpendicular to the Z direction of the reference coordinate system will be referred to as a first straight line L1 and a second straight line L2. In the present embodiment, specifically, the first straight line L1 is parallel to the X direction of the reference coordinate system, and the second straight line L2 is parallel to the Y direction of the reference coordinate system.

In the present embodiment, the first magnetic sensor 10 includes a first portion 11 and a second portion 12 located at different positions from each other in the X direction of the reference coordinate system. The first area A10 includes a first partial area A11 formed by vertically projecting the first portion 11 of the first magnetic sensor 10 onto the reference plane RP, and a second partial area A12 formed by vertically projecting the second portion 12 of the first magnetic sensor 10 onto the reference plane RP. The first and second partial areas A11 and A12 are located on opposite sides of the third area A30 in a direction parallel to the first straight line L1.

The second magnetic sensor 20 includes a first portion 21 and a second portion 22 located at different positions from each other in the Y direction of the reference coordinate system. The second area A20 includes a third partial area A21 formed by vertically projecting the first portion 21 of the second magnetic sensor 20 onto the reference plane RP, and a fourth partial area A22 formed by vertically projecting the second portion 22 of the second magnetic sensor 20 onto the reference plane RP. The third and fourth partial areas A21 and A22 are located on opposite sides of the third area A30 in a direction parallel to the second straight line L2.

In the present embodiment, both the first and second partial areas A11 and A12 are located to be intersected by the first straight line L1. Both the third and fourth partial areas A21 and A22 are located to be intersected by the second straight line L2.

It is preferred that no portion of the first area A10 be intersected by the second straight line L2. It is also preferred that no portion of the second area A20 be intersected by the first straight line L1.

In the present embodiment, in particular, the first area A10 and the second area A20 as viewed from above have such a positional relationship that the first area A10 coincides with the second area A20 if the first area A10 is rotated 90° around the centroid C30 of the third area A30. In FIG. 3, if the first and second partial areas A11 and A12 are rotated 90° counterclockwise around the centroid C30, the first and second partial areas A11 and A12 coincide with the third and fourth partial areas A21 and A22, respectively.

Each of the first to third magnetic sensors 10, 20 and 30 includes at least one magnetic detection element.

Figure 4:
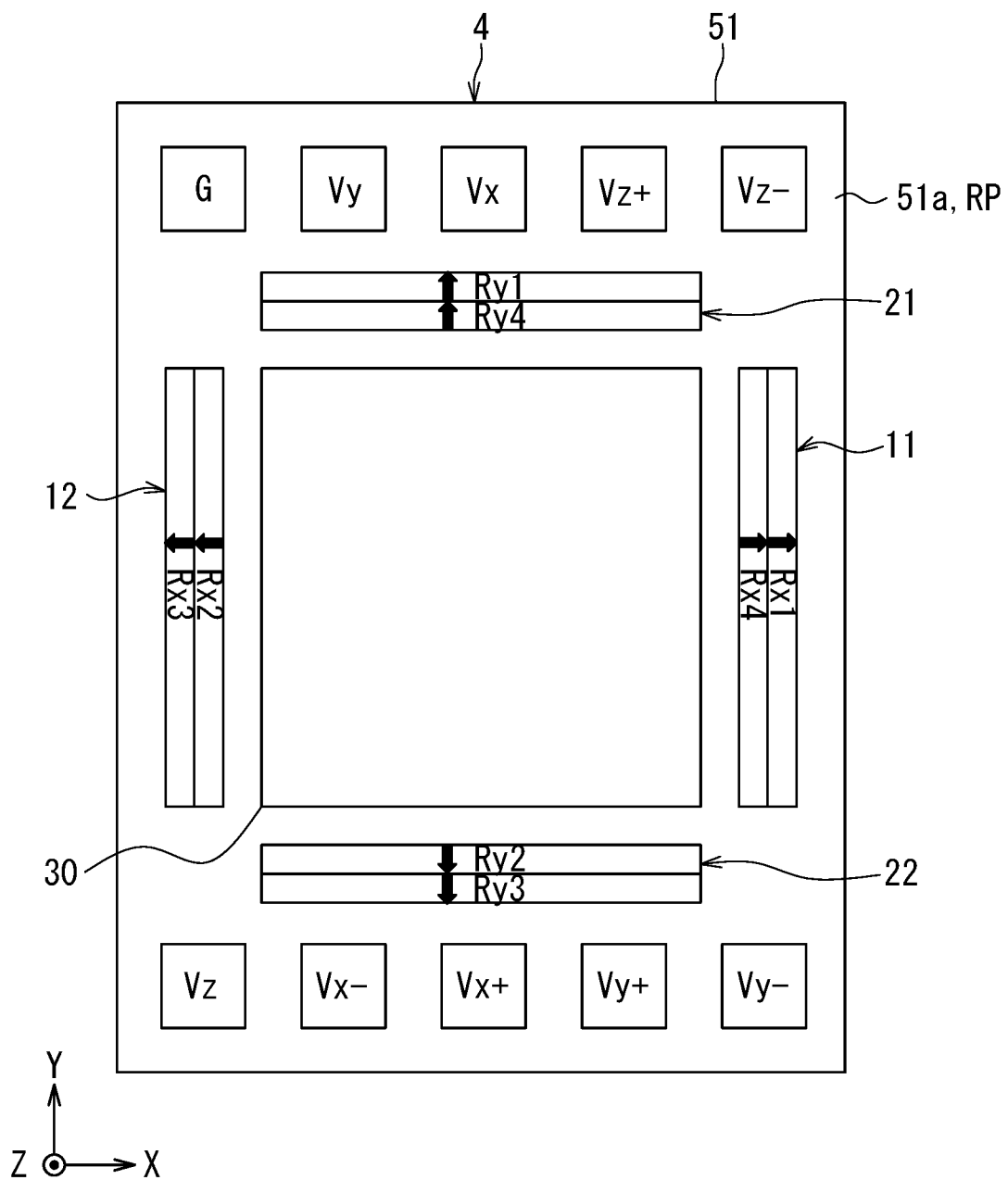
FIG. 4 is an explanatory diagram showing a configuration of the sensor chip of the first embodiment of the invention.
Figure 5:
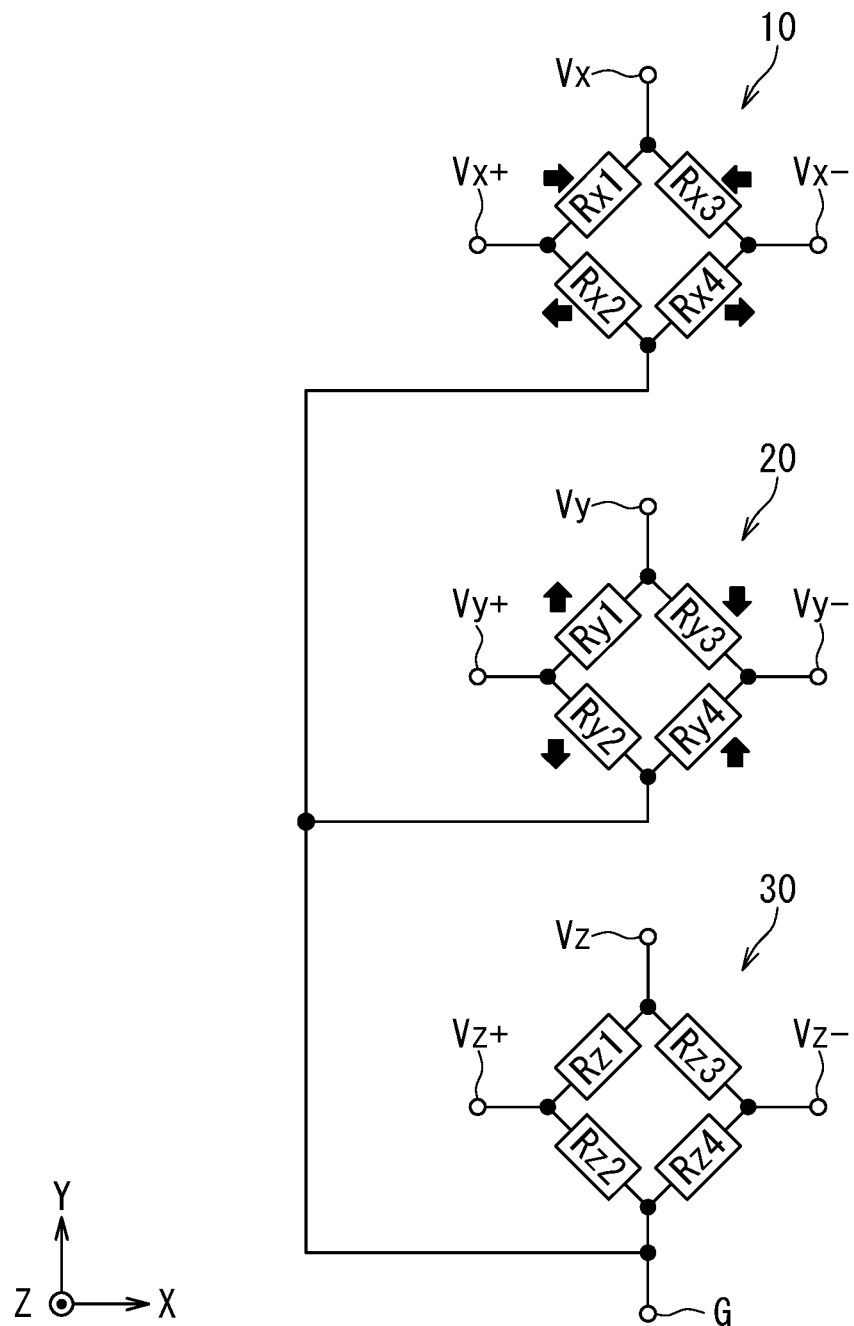
FIG. 5 is a circuit diagram showing an example circuit configuration of the sensor chip of the first embodiment of the invention.

Reference is now made to FIG. 4 and FIG. 5 to describe an example configuration of the sensor chip 4. FIG. 4 is an explanatory diagram showing a configuration of the sensor chip 4. FIG. 5 is a circuit diagram showing an example circuit configuration of the sensor chip 4.

As described above, the first magnetic sensor 10 generates the first detection signal having a correspondence with the first external magnetic field component, which is a component of an external magnetic field and is in the first sensing direction. The second magnetic sensor 20 generates the second detection signal having a correspondence with the second external magnetic field component, which is a component of the external magnetic field and is in the second sensing direction. The third magnetic sensor 30 generates the third detection signal having a correspondence with the third external magnetic field component, which is a component of the external magnetic field and is in the third sensing direction.

In the present embodiment, specifically, the first sensing direction is a direction parallel to the X direction of the first sensor coordinate system. The first sensing direction includes the X direction and the −X direction of the first sensor coordinate system. The second sensing direction is a direction parallel to the Y direction of the second sensor coordinate system. The second sensing direction includes the Y direction and the −Y direction of the second sensor coordinate system. The third sensing direction is a direction parallel to the Z direction of the third sensor coordinate system. The third sensing direction includes the Z direction and the −Z direction of the third sensor coordinate system.

As shown in FIG. 4, the group of terminals of the sensor chip 4 includes: a power supply terminal Vx and output terminals Vx+ and Vx− associated with the first magnetic sensor 10; a power supply terminal Vy and output terminals Vy+ and Vy− associated with the second magnetic sensor 20; a power supply terminal Vz and output terminals Vz+ and Vz− associated with the third magnetic sensor 30; and a ground terminal G shared among the first to third magnetic sensors 10, 20 and 30.

In the example shown in FIG. 5, the first magnetic sensor 10 includes four resistor sections Rx1, Rx2, Rx3 and Rx4 constituting a Wheatstone bridge circuit. Each of the resistor sections Rx1, Rx2, Rx3 and Rx4 has a resistance that varies depending on the first external magnetic field component. The resistor section Rx1 is provided between the power supply terminal Vx and the output terminal Vx+. The resistor section Rx2 is provided between the output terminal Vx+ and the ground terminal G. The resistor section Rx3 is provided between the power supply terminal Vx and the output terminal Vx−. The resistor section Rx4 is provided between the output terminal Vx− and the ground terminal G.

The second magnetic sensor 20 includes four resistor sections Ry1, Ry2, Ry3 and Ry4 constituting a Wheatstone bridge circuit. Each of the resistor sections Ry1, Ry2, Ry3 and Ry4 has a resistance that varies depending on the second external magnetic field component. The resistor section Ry1 is provided between the power supply terminal Vy and the output terminal Vy+. The resistor section Ry2 is provided between the output terminal Vy+ and the ground terminal G. The resistor section Ry3 is provided between the power supply terminal Vy and the output terminal Vy−. The resistor section Ry4 is provided between the output terminal Vy− and the ground terminal G.

The third magnetic sensor 30 includes four resistor sections Rz1, Rz2, Rz3 and Rz4 constituting a Wheatstone bridge circuit. Each of the resistor sections Rz1, Rz2, Rz3 and Rz4 has a resistance that varies depending on an output magnetic field component outputted from a magnetic field conversion section, which will be described later. The resistor section Rz1 is provided between the power supply terminal Vz and the output terminal Vz+. The resistor section Rz2 is provided between the output terminal Vz+ and the ground terminal G. The resistor section Rz3 is provided between the power supply terminal Vz and the output terminal Vz−. The resistor section Rz4 is provided between the output terminal Vz− and the ground terminal G.

Hereinafter, the term "resistor section R" is used to refer to any one of the resistor sections Rx1, Rx2, Rx3, Rx4, Ry1, Ry2, Ry3, Ry4, Rz1, Rz2, Rz3, and Rz4. Each resistor section R includes at least one magnetic detection element. In the present embodiment, the at least one magnetic detection element is specifically at least one magnetoresistive element. The magnetoresistive element will hereinafter be referred to as MR element.

In the present embodiment, the MR element is specifically a spin-valve MR element. The spin-valve MR element includes a magnetization pinned layer having a magnetization in a fixed direction, a free layer having a magnetization whose direction is variable depending on the direction of an applied magnetic field, and a gap layer located between the magnetization pinned layer and the free layer. The spin-valve MR element may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The resistance of the spin-valve MR element changes with the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°. In each MR element, the free layer has a shape anisotropy that sets the direction of the magnetization easy axis to be orthogonal to the magnetization direction of the magnetization pinned layer.

In FIG. 5, the filled arrows indicate the magnetization directions of the magnetization pinned layers of the MR elements. In the example shown in FIG. 5, the magnetization pinned layers of the MR elements in each of the resistor sections Rx1 and Rx4 are magnetized in the X direction of the first sensor coordinate system. The magnetization pinned layers of the MR elements in each of the resistor sections Rx2 and Rx3 are magnetized in the −X direction of the first sensor coordinate system.

The magnetization pinned layers of the MR elements in each of the resistor sections Ry1 and Ry4 are magnetized in the Y direction of the second sensor coordinate system. The magnetization pinned layers of the MR elements in each of the resistor sections Ry2 and Ry3 are magnetized in the −Y direction of the second sensor coordinate system. The magnetization directions of the magnetization pinned layers of the MR elements in each of the resistor sections Rz1, Rz2, Rz3 and Rz4 will be described later.

A potential difference between the output terminals Vx+ and Vx− has a correspondence with the first external magnetic field component. The first magnetic sensor 10 generates the first detection signal corresponding to the potential difference between the output terminals Vx+ and Vx−. The first detection signal may be one obtained by adjusting the amplitude or offset of the potential difference between the output terminals Vx+ and Vx−.

A potential difference between the output terminals Vy+ and Vy− has a correspondence with the second external magnetic field component. The second magnetic sensor 20 generates the second detection signal corresponding to the potential difference between the output terminals Vy+ and Vy−. The second detection signal may be one obtained by adjusting the amplitude or offset of the potential difference between the output terminals Vy+ and Vy−.

A potential difference between the output terminals Vz+ and Vz− has a correspondence with the third external magnetic field component. The third magnetic sensor 30 generates the third detection signal corresponding to the potential difference between the output terminals Vz+ and Vz−. The third detection signal may be one obtained by adjusting the amplitude or offset of the potential difference between the output terminals Vz+ and Vz−.

Reference is now made to FIG. 4 to describe an example layout of the resistor sections Rx1, Rx2, Rx3, Rx4, Ry1, Ry2, Ry3, and Ry4. In this example, the first portion 11 of the first magnetic sensor 10 includes the resistor sections Rx1 and Rx4, and the second portion 12 of the first magnetic sensor 10 includes the resistor sections Rx2 and Rx3. The first portion 21 of the second magnetic sensor 20 includes the resistor sections Ry1 and Ry4, and the second portion 22 of the second magnetic sensor 20 includes the resistor sections Ry2 and Ry3.

In FIG. 4, the filled arrows indicate the magnetization directions of the magnetization pinned layers of the MR elements. In the example shown in FIG. 4, in each of the first portion 11 of the first magnetic sensor 10, the second portion 12 of the first magnetic sensor 10, the first portion 21 of the second magnetic sensor 20, and the second portion 22 of the second magnetic sensor 20, the magnetization pinned layers of the MR elements included therein have the same magnetization direction. Such an example makes it easy to set the magnetization directions of the magnetization pinned layers in a plurality of MR elements.

An example configuration of MR elements will now be described with reference to FIG. 6. An MR element 100 shown in FIG. 6 includes an antiferromagnetic layer 101, a magnetization pinned layer 102, a gap layer 103, and a free layer 104 which are stacked in this order, from closest to farthest from the substrate 51. The antiferromagnetic layer 101 is formed of an antiferromagnetic material, and is in exchange coupling with the magnetization pinned layer 102 to thereby pin the magnetization direction of the magnetization pinned layer 102.

Figure 6:
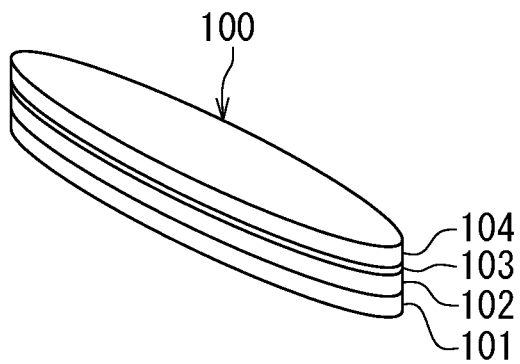
FIG. 6 is a perspective view showing a magnetoresistive element of the first embodiment of the invention.

It should be appreciated that the layers 101 to 104 of the MR element 100 may be stacked in the reverse order to that shown in FIG. 6. The MR element 100 may be configured without the antiferromagnetic layer 101. In such a case, the configuration of the MR element 100 may be such that, for example, the antiferromagnetic layer 101 and the magnetization pinned layer 102 are replaced with a magnetization pinned layer of an artificial antiferromagnetic structure, which includes two ferromagnetic layers and a nonmagnetic metal layer interposed between the two ferromagnetic layers. The magnetic detection element may be an element for detecting a magnetic field other than the MR element, such as a Hall element or a magnetic impedance element.

Figure 7:
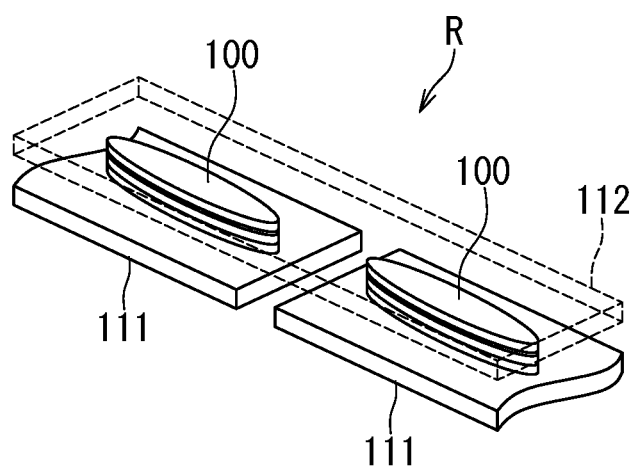
FIG. 7 is a perspective view showing part of a resistor section of the first embodiment of the invention.

Next, an example configuration of the resistor section R will be described with reference to FIG. 7. In this example, the resistor section R includes a plurality of MR elements 100 connected in series. The resistor section R further includes one or more connection layers for electrically connecting two MR elements 100 that are adjacent to each other in circuit configuration, so that the plurality of MR elements 100 are connected in series. In the example shown in FIG. 7 the resistor section R includes, as the one or more connection layers, one or more lower connection layers 111 and one or more upper connection layers 112. The lower connection layer 111 is in contact with the bottom surfaces of two MR elements 100 adjacent to each other in circuit configuration, and electrically connects the two MR elements 100. The upper connection layer 112 is in contact with the top surfaces of two MR elements 100 adjacent to each other in circuit configuration, and electrically connects the two MR elements 100.

Next, an example configuration of the third magnetic sensor 30 will be described with reference to FIG. 8. The third magnetic sensor 30 includes a soft magnetic structure 40 formed of a soft magnetic material, in addition to the resistor sections Rz1, Rz2, Rz3 and Rz4. The soft magnetic structure 40 includes a magnetic field conversion section 42 and at least one soft magnetic layer. The magnetic field conversion section 42 receives the third external magnetic field component and outputs an output magnetic field component that is in a direction perpendicular to the third sensing direction. The strength of the output magnetic field component has a correspondence with the strength of the third external magnetic field component. The third magnetic sensor 30 detects the strength of the third external magnetic field component by detecting the strength of the output magnetic field component.

Figure 8:
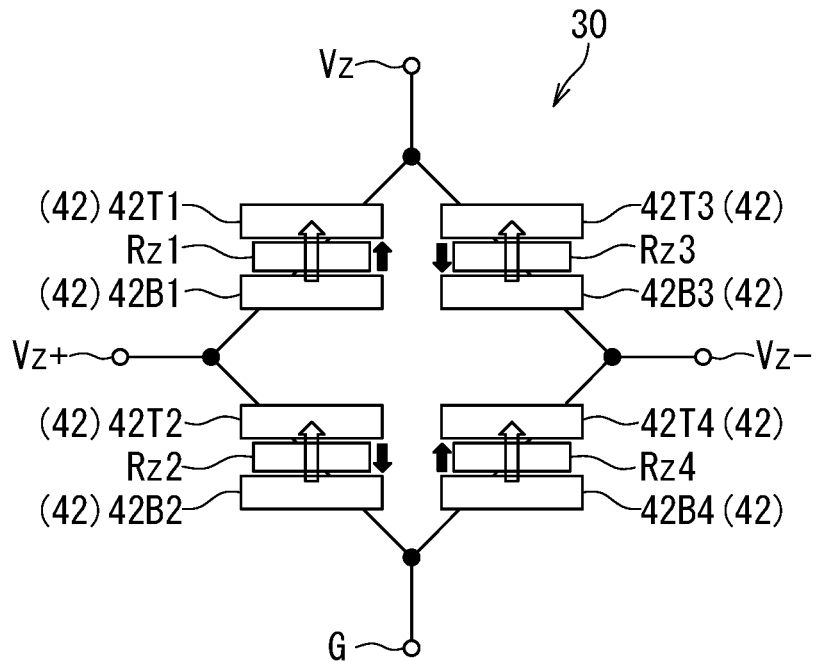
FIG. 8 is an explanatory diagram showing a configuration of a magnetic field conversion section and a third magnetic sensor of the first embodiment of the invention.

In the example shown in FIG. 8, the magnetic field conversion section 42 includes: a lower yoke 42B1 and an upper yoke 42T1 associated with the resistor section Rz1; a lower yoke 42B2 and an upper yoke 42T2 associated with the resistor section Rz2; a lower yoke 42B3 and an upper yoke 42T3 associated with the resistor section Rz3; and a lower yoke 42B4 and an upper yoke 42T4 associated with the resistor section Rz4.

The lower yokes 42B1, 42B2, 42B3 and 42B4 and the upper yokes 42T1, 42T2, 42T3 and 42T4 each have a rectangular parallelepiped shape elongated in a direction perpendicular to the Z direction of the third sensor coordinate system.

The lower yoke 42B1 and the upper yoke 42T1 are located near the resistor section Rz1. The lower yoke 42B1 is located closer to the top surface 51a of the substrate 51 than the resistor section Rz1. The upper yoke 42T1 is located farther from the top surface 51a of the substrate 51 than the resistor section Rz1. As viewed from above, the resistor section Rz1 lies between the lower yoke 42B1 and the upper yoke 42T1.

The lower yoke 42B2 and the upper yoke 42T2 are located near the resistor section Rz2. The lower yoke 42B2 is located closer to the top surface 51a of the substrate 51 than the resistor section Rz2. The upper yoke 42T2 is located farther from the top surface 51a of the substrate 51 than the resistor section Rz2. As viewed from above, the resistor section Rz2 lies between the lower yoke 42B2 and the upper yoke 42T2.

The lower yoke 42B3 and the upper yoke 42T3 are located near the resistor section Rz3. The lower yoke 42B3 is located closer to the top surface 51a of the substrate 51 than the resistor section Rz3. The upper yoke 42T3 is located farther from the top surface 51a of the substrate 51 than the resistor section Rz3. As viewed from above, the resistor section Rz3 lies between the lower yoke 42B3 and the upper yoke 42T3.

The lower yoke 42B4 and the upper yoke 42T4 are located near the resistor section Rz4. The lower yoke 42B4 is located closer to the top surface 51a of the substrate 51 than the resistor section Rz4. The upper yoke 42T4 is located farther from the top surface 51a of the substrate 51 than the resistor section Rz4. As viewed from above, the resistor section Rz4 lies between the lower yoke 42B4 and the upper yoke 42T4.

The output magnetic field component outputted by the magnetic field conversion section 42 contains a magnetic field component that is generated by the lower yoke 42B1 and the upper yoke 42T1 and applied to the resistor section Rz1, a magnetic field component that is generated by the lower yoke 42B2 and the upper yoke 42T2 and applied to the resistor section Rz2, a magnetic field component that is generated by the lower yoke 42B3 and the upper yoke 42T3 and applied to the resistor section Rz3, and a magnetic field component that is generated by the lower yoke 42B4 and the upper yoke 42T4 and applied to the resistor section Rz4.

In FIG. 8, the four hollow arrows indicate the direction of the magnetic field components applied to the resistor sections Rz1, Rz2, Rz3 and Rz4 when the third external magnetic field component is in the Z direction of the third sensor coordinate system. On the other hand, in FIG. 8 the four filled arrows indicate the magnetization directions of the magnetization pinned layers 102 of the MR elements 100 of the resistor sections Rz1, Rz2, Rz3 and Rz4, respectively. The magnetization directions of the magnetization pinned layers 102 of the MR elements 100 of the resistor sections Rz1 and Rz4 are the same as the directions of the magnetic field components that are applied to the resistor sections Rz1 and Rz4, respectively, when the third external magnetic field component is in the Z direction of the third sensor coordinate system. The magnetization directions of the magnetization pinned layers 102 of the MR elements 100 of the resistor sections Rz2 and Rz3 are opposite to the directions of the magnetic field components that are applied to the resistor sections Rz2 and Rz3, respectively, when the third external magnetic field component is in the Z direction of the third sensor coordinate system.

Now, the function of the third magnetic sensor 30 will be described. When there is no third external magnetic field component, the magnetization direction of the free layer 104 of each MR element 100 in the resistor sections Rz1, Rz2, Rz3 and Rz4 is perpendicular to the magnetization direction of the magnetization pinned layer 102.

If the third external magnetic field component is in the Z direction of the third sensor coordinate system, the magnetization direction of the free layer 104 of each MR element 100 in the resistor sections Rz1 and Rz4 tilts toward the magnetization direction of the magnetization pinned layer 102 from the direction perpendicular to the magnetization direction of the magnetization pinned layer 102. On the other hand, the magnetization direction of the free layer 104 of each MR element 100 in the resistor sections Rz2 and Rz3 tilts toward a direction opposite to the magnetization direction of the magnetization pinned layer 102 from the direction perpendicular to the magnetization direction of the magnetization pinned layer 102. As a result, the resistor sections Rz1 and Rz4 decrease in resistance while the resistor sections Rz2 and Rz3 increase in resistance, compared to when there is no third external magnetic field component.

In contrast to this, if the third external magnetic field component is in the −Z direction of the third sensor coordinate system, the resistor sections Rz1 and Rz4 increase in resistance while the resistor sections Rz2 and Rz3 decrease in resistance, compared to when there is no third external magnetic field component.

The amount of change in the resistance of each of the resistor sections Rz1, Rz2, Rz3 and Rz4 depends on the strength of the third external magnetic field component.

Changes in the direction and strength of the third external magnetic field component cause the resistor sections Rz1, Rz2, Rz3 and Rz4 to change in resistance such that the resistor sections Rz1 and Rz4 increase in resistance while the second and third resistor sections Rz2 and Rz3 decrease in resistance, or such that the resistor sections Rz1 and Rz4 decrease in resistance while the resistor sections Rz2 and Rz3 increase in resistance. This causes a change in a potential difference between the output terminals Vz+ and Vz−. It is thus possible to detect the third external magnetic field component based on the potential difference. The third magnetic sensor 30 generates the third detection signal corresponding to the potential difference between the output terminals Vz+ and Vz−. The third detection signal may be one obtained by adjusting the amplitude or offset of the potential difference between the output terminals Vz+ and Vz−.

Next, an example structure of the sensor chip 4 will be described. FIG. 9 is a cross-sectional view of the sensor chip 4. The sensor chip 4 includes the substrate 51 having the top surface 51a and the bottom surface 51b, and also a first integration portion 52 and a second integration portion 53 stacked on the top surface 51a of the substrate 51. The first integration portion 52 includes the magnetic field generation section 70. The second integration portion 53 includes the first to third magnetic sensors 10, 20, and 30. FIGS. 3 and 4 omit the illustration of the first integration portion 52.

Figure 11:
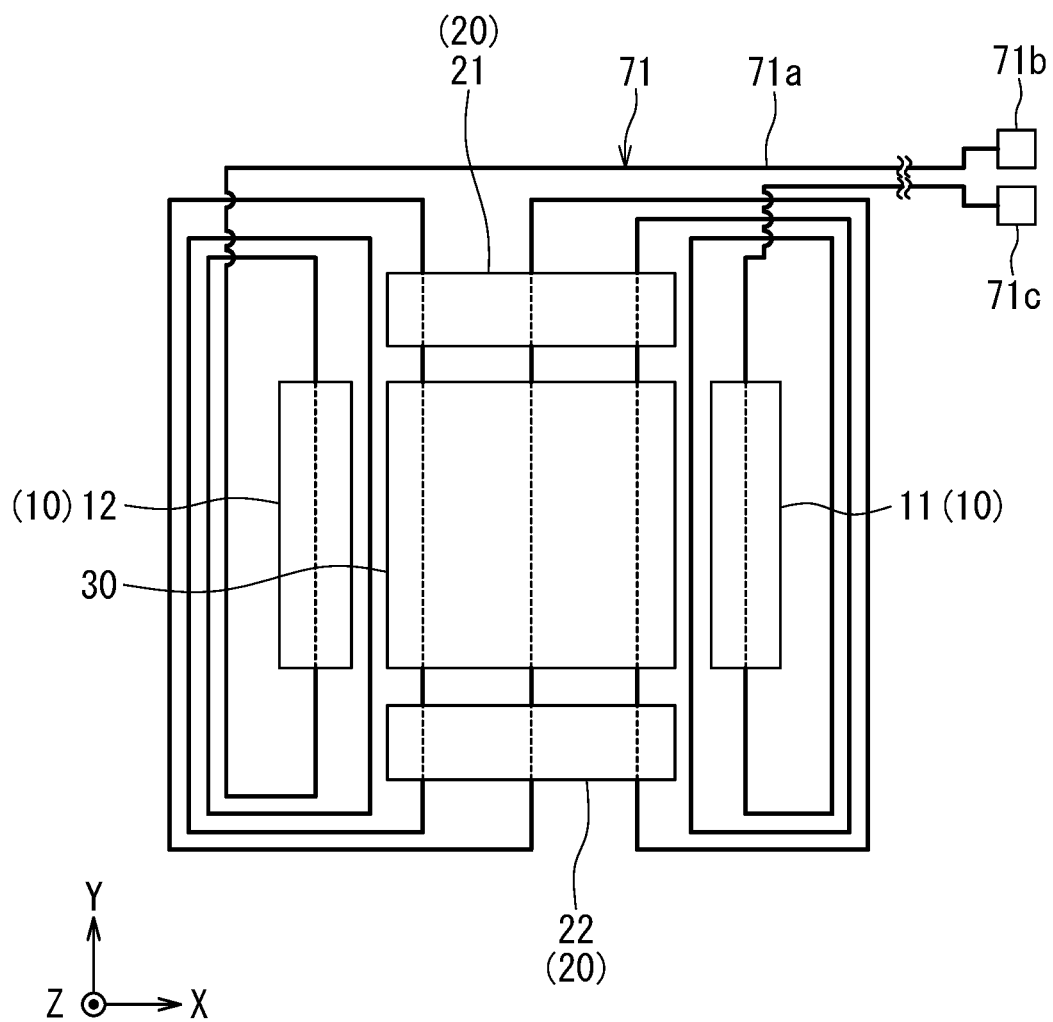
FIG. 11 is an explanatory diagram schematically showing a first magnetic field generator of the first embodiment of the invention.
Figure 12:
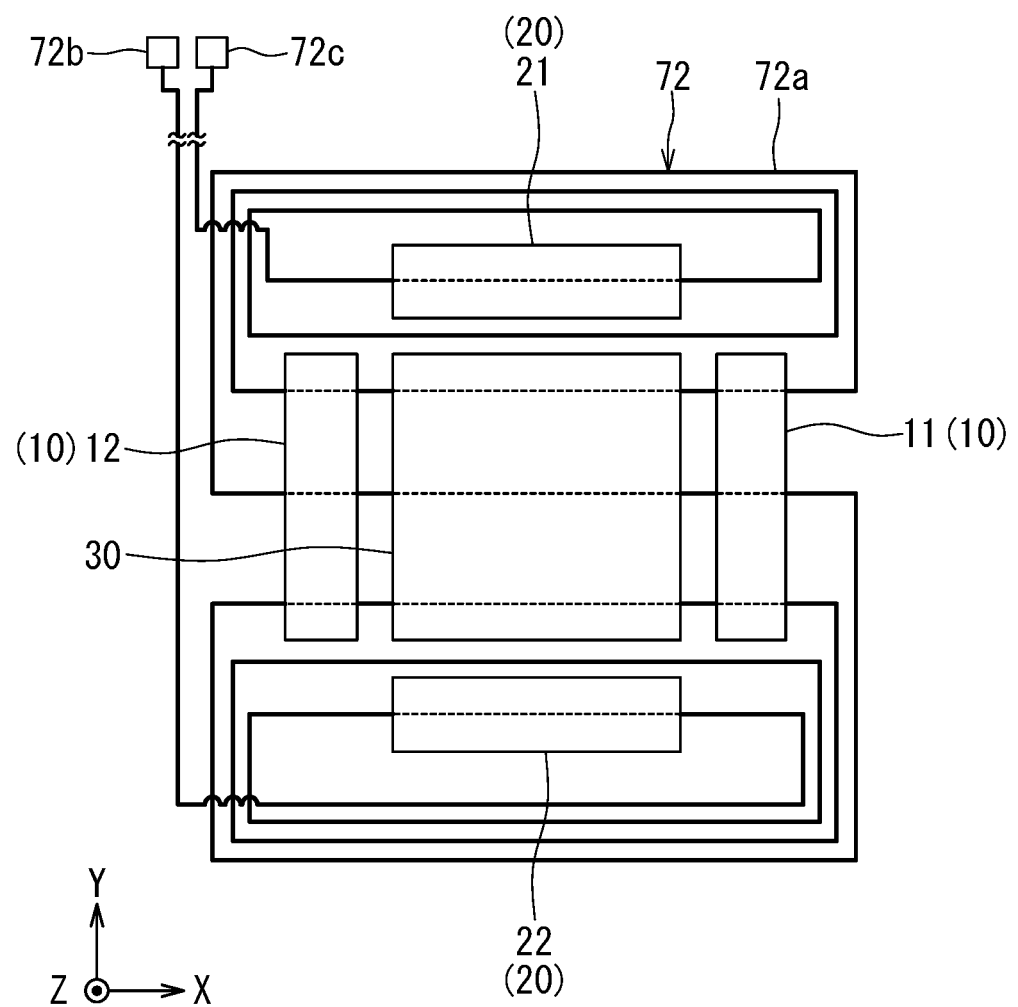
FIG. 12 is an explanatory diagram schematically showing a second magnetic field generator of the first embodiment of the invention.
Figure 13:
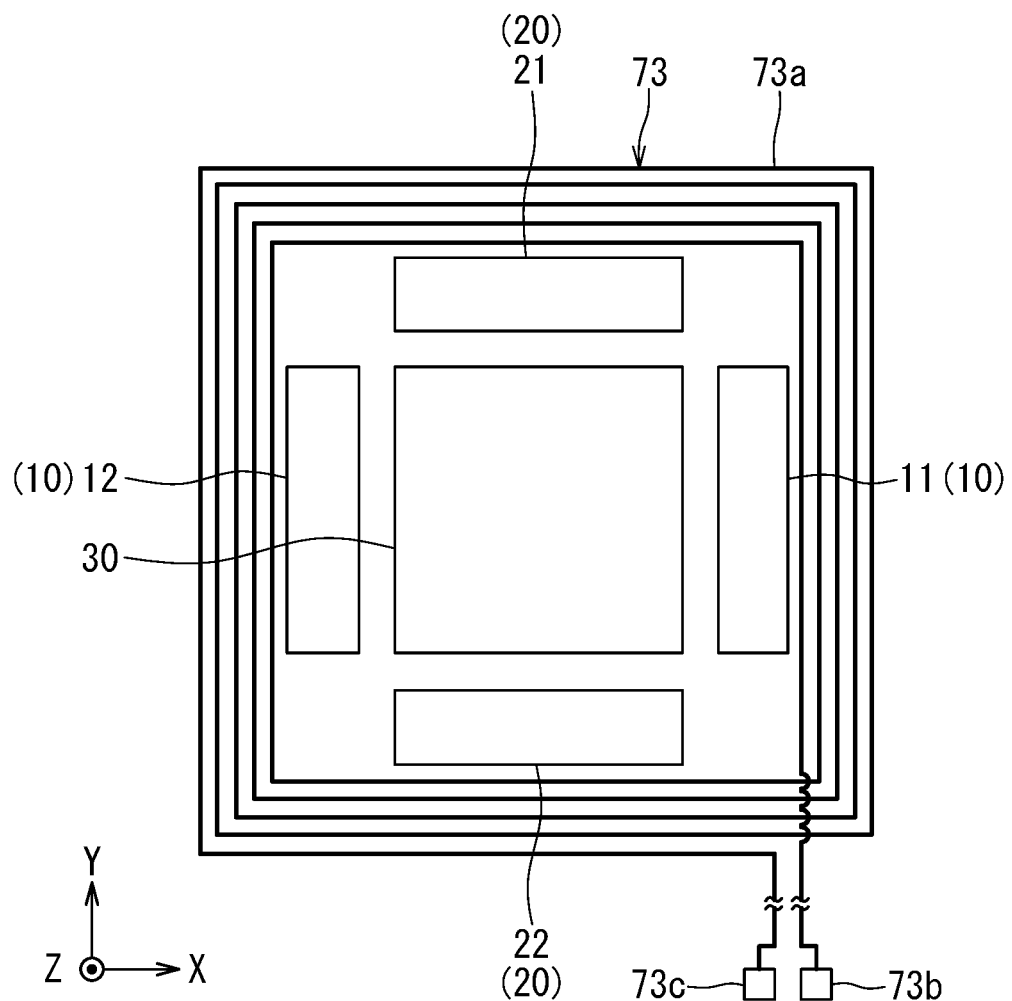
FIG. 13 is an explanatory diagram schematically showing a third magnetic field generator of the first embodiment of the invention.

The magnetic field generation section 70 includes a first magnetic field generator 71, a second magnetic field generator 72, and a third magnetic field generator 73. The first to third magnetic field generators 71 to 73 are shown in FIGS. 11 to 13 to be described later. The first to third magnetic field generators 71 to 73 are located in the first integration portion 52 at positions different from each other in a direction perpendicular to the top surface 51a of the substrate 51. The first to third magnetic sensors 10, 20 and 30 and the first to third magnetic field generators 71 to 73 are integrated in the sensor chip 4. The first to third magnetic field generators 71 to 73 will be described later.

Figure 10:
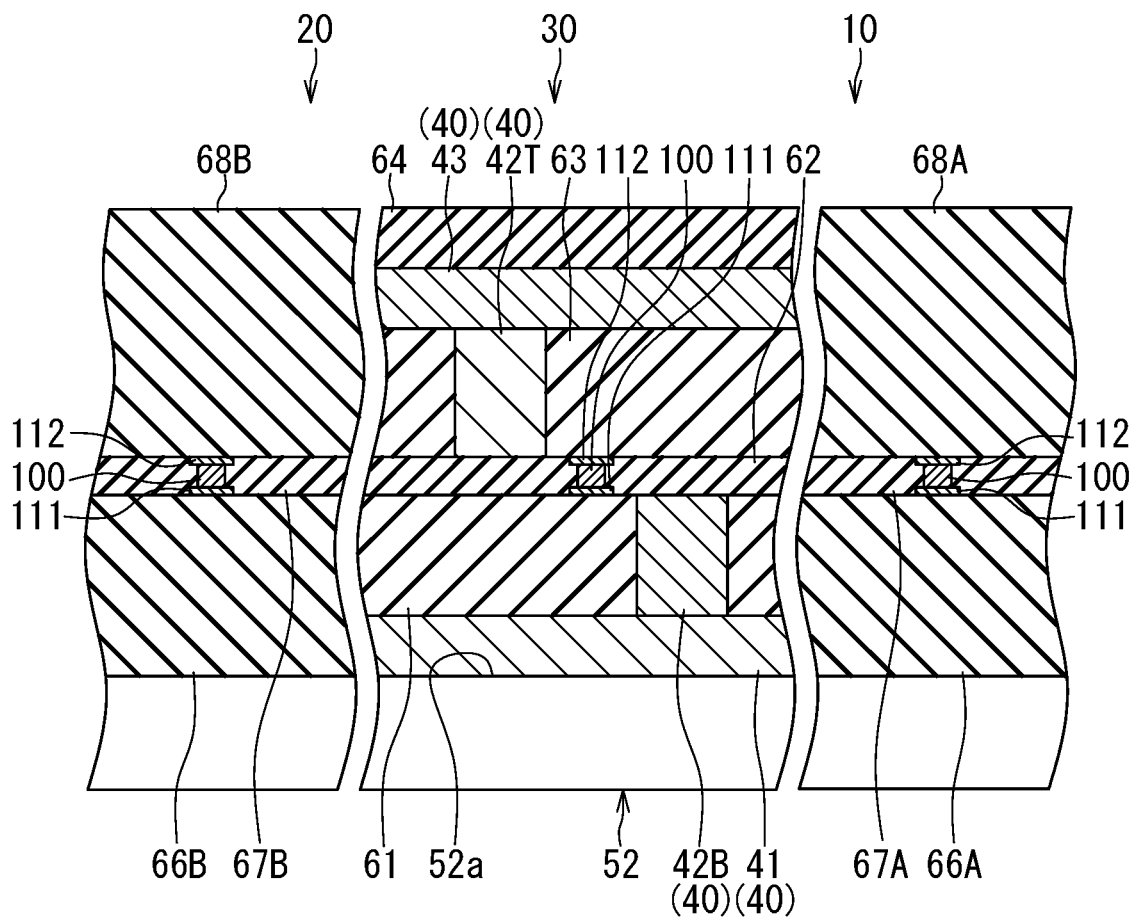
FIG. 10 is a cross-sectional view showing a portion of each of first to third magnetic sensors and a soft magnetic structure of the first embodiment of the invention.

FIG. 10 shows a portion of each of the first to third magnetic sensors 10, 20 and 30. In this example, the first to third magnetic sensors 10, 20 and 30 are disposed on the first integration portion 52. The first integration portion 52 has a top surface 52a. The top surface 52a of the first integration portion 52 has an insulation property.

The first magnetic sensor 10 includes insulating layers 66A, 67A and 68A each formed of an insulating material, in addition to the resistor sections Rx1, Rx2, Rx3 and Rx4. The insulating layer 66A lies on the top surface 52a of the first integration portion 52. The resistor sections Rx1, Rx2, Rx3 and Rx4 are arranged on the insulating layer 66A. FIG. 10 shows one of the plurality of MR elements 100 included in the resistor sections Rx1, Rx2, Rx3 and Rx4, and also the upper connection layer 112 and the lower connection layer 111 connected to the MR element 100. The insulating layer 67A lies on the top surface of the insulating layer 66A and surrounds the resistor sections Rx1, Rx2, Rx3 and Rx4. The insulating layer 68A covers the resistor sections Rx1, Rx2, Rx3 and Rx4 and the insulating layer 67A.

The second magnetic sensor 20 is structurally similar to the first magnetic sensor 10. More specifically, the second magnetic sensor 20 includes insulating layers 66B, 67B and 68B each formed of an insulating material, in addition to the resistor sections Ry1, Ry2, Ry3 and Ry4. The insulating layer 66B lies on the top surface 52a of the first integration portion 52. The resistor sections Ry1, Ry2, Ry3 and Ry4 are arranged on the insulating layer 66B. FIG. 10 shows one of the plurality of MR elements 100 included in the resistor sections Ry1, Ry2, Ry3 and Ry4, and also the upper connection layer 112 and the lower connection layer 111 connected to the MR element 100. The insulating layer 67B lies on the top surface of the insulating layer 66B and surrounds the resistor sections Ry1, Ry2, Ry3 and Ry4. The insulating layer 68B covers the resistor sections Ry1, Ry2, Ry3 and Ry4 and the insulating layer 67B.

The third magnetic sensor 30 includes insulating layers 61, 62, 63 and 64 each formed of an insulating material, in addition to the resistor sections Rz1, Rz2, Rz3 and Rz4 and the soft magnetic structure 40. In the example shown in FIG. 10, the soft magnetic structure 40 includes the magnetic field conversion section 42 and two soft magnetic layers 41 and 43.

The magnetic field conversion section 42 includes the lower yokes 42B1, 42B2, 42B3 and 42B4 and the upper yokes 42T1, 42T2, 42T3 and 42T4 shown in FIG. 8. In FIG. 10, one of the lower yokes 42B1, 42B2, 42B3 and 42B4 is denoted by the reference symbol 42B, and a corresponding one of the upper yokes 42T1, 42T2, 42T3 and 42T4 is denoted by the reference symbol 42T.

The soft magnetic layer 41 lies on the top surface 52a of the first integration portion 52. The lower yokes 42B1, 42B2, 42B3 and 42B4 are arranged on the soft magnetic layer 41. The insulating layer 61 lies on the soft magnetic layer 41 and surrounds the lower yokes 42B1, 42B2, 42B3 and 42B4.

The resistor sections Rz1, Rz2, Rz3 and Rz4 are arranged on the insulating layer 61. FIG. 10 shows one of the plurality of MR elements 100 included in the resistor sections Rz1, Rz2, Rz3 and Rz4, and also the upper connection layer 112 and the lower connection layer 111 connected to the MR element 100. The insulating layer 62 lies on the lower yokes 42B1, 42B2, 42B3 and 42B4 and the insulating layer 61, and surrounds the resistor sections Rz1, Rz2, Rz3 and Rz4.

The upper yokes 42T1, 42T2, 42T3 and 42T4 are arranged on the insulating layer 62. The insulating layer 63 lies on the resistor sections Rz1, Rz2, Rz3 and Rz4 and the insulating layer 62, and surrounds the upper yokes 42T1, 42T2, 42T3 and 42T4.

The soft magnetic layer 43 lies on the upper yokes 42T1, 42T2, 42T3 and 42T4 and the insulating layer 63. The insulating layer 64 covers the soft magnetic layer 43.

As viewed from above, the soft magnetic layers 41 and 43 extend across the entire area or almost the entire area of the third magnetic sensor 30. In other words, both of an area formed by vertically projecting the soft magnetic layer 41 onto the reference plane RP and an area formed by vertically projecting the soft magnetic layer 43 onto the reference plane RP coincide with or almost coincide with the third area A30.

In the example shown in FIG. 10, all the magnetic detection elements or MR elements 100 included in the first to third magnetic sensors 10, 20 and 30 are located at the same distance from the top surface 52a of the first integration portion 52. In the present embodiment, the top surface 52a of the first integration portion 52 is parallel to the top surface 51a of the substrate 51. All the MR elements 100 included in the first to third magnetic sensors 10, 20 and 30 are therefore located at the same distance from the top surface 51a of the substrate 51, i.e., the reference plane RP.

The magnetic field conversion section 42 may include only either the lower yokes 42B1, 42B2, 42B3 and 42B4 or the upper yokes 42T1, 42T2, 42T3 and 42T4. The soft magnetic structure 40 may include only either one of the soft magnetic layers 41 and 43.

The first to third magnetic field generators 71 to 73 will now be described. The first to third magnetic field generators 71 to 73 are located between the top surface 51a (see FIG. 9) of the substrate 51 and the first to third magnetic sensors 10, 20 and 30.

The first magnetic field generator 71 will be described first, with reference to FIG. 11. FIG. 11 is an explanatory diagram schematically showing the first magnetic field generator 71. The first magnetic field generator 71 is capable of generating a first additional magnetic field. The first to third magnetic sensors 10, 20 and 30 are each subjected to a first additional magnetic field component when the first additional magnetic field is generated by the first magnetic field generator 71. The first additional magnetic field component is a component of the first additional magnetic field and is in a direction parallel to a first direction. In the present embodiment, specifically, the first direction coincides with the X direction of the reference coordinate system.

As shown in FIG. 11, the first magnetic field generator 71 includes a coil conductor 71a, and two terminals 71b and 71c connected to opposite ends of the coil conductor 71a. The terminals 71b and 71c are each connected to the driving section 86 (see FIG. 2) of the correction processor 80.

The coil conductor 71a includes a plurality of first conductor portions that overlap at least one of the first to third magnetic sensors 10, 20 and 30 as viewed from above and extend in a direction parallel to the Y direction of the reference coordinate system. The coil conductor 71a is wound along the XY plane of the reference coordinate system so that when a current is passed from the terminal 71b to the terminal 71c, the direction of the current flowing through each of the plurality of first conductor portions becomes the Y direction of the reference coordinate system.

If a current is passed in the direction from the terminal 71b to the terminal 71c, the direction of the current flowing through each of the plurality of first conductor portions becomes the Y direction of the reference coordinate system, and the direction of the first additional magnetic field component becomes the X direction of the reference coordinate system. If the direction of the current in the above example is reversed, the direction of the first additional magnetic field component becomes the −X direction of the reference coordinate system.

Next, the second magnetic field generator 72 will be described with reference to FIG. 12. FIG. 12 is an explanatory diagram schematically showing the second magnetic field generator 72. The second magnetic field generator 72 is capable of generating a second additional magnetic field. The first to third magnetic sensors 10, 20 and 30 are each subjected to a second additional magnetic field component when the second additional magnetic field is generated by the second magnetic field generator 72. The second additional magnetic field component is a component of the second additional magnetic field and is in a direction parallel to a second direction. In the present embodiment, specifically, the second direction coincides with the Y direction of the reference coordinate system.

As shown in FIG. 12, the second magnetic field generator 72 includes a coil conductor 72a, and two terminals 72b and 72c connected to opposite ends of the coil conductor 72a. The terminals 72b and 72c are each connected to the driving section 86 (see FIG. 2) of the correction processor 80.

The coil conductor 72a includes a plurality of second conductor portions that overlap at least one of the first to third magnetic sensors 10, 20 and 30 as viewed from above and extend in a direction parallel to the X direction of the reference coordinate system. The coil conductor 72a is wound along the XY plane of the reference coordinate system so that when a current is passed from the terminal 72b to the terminal 72c, the direction of the current flowing through each of the plurality of second conductor portions becomes the −X direction of the reference coordinate system.

If a current is passed in the direction from the terminal 72b to the terminal 72c, the direction of the current flowing through each of the plurality of second conductor portions becomes the −X direction of the reference coordinate system, and the direction of the second additional magnetic field component becomes the Y direction of the reference coordinate system. If the direction of the current in the above example is reversed, the direction of the second additional magnetic field component becomes the −Y direction of the reference coordinate system.

Next, the third magnetic field generator 73 will be described with reference to FIG. 13. FIG. 13 is an explanatory diagram schematically showing the third magnetic field generator 73. The third magnetic field generator 73 is capable of generating a third additional magnetic field. The first to third magnetic sensors 10, 20 and 30 are each subjected to a third additional magnetic field component when the third additional magnetic field is generated by the third magnetic field generator 73. The third additional magnetic field component is a component of the third additional magnetic field and is in a direction parallel to a third direction. In the present embodiment, specifically, the third direction coincides with the Z direction of the reference coordinate system.

As shown in FIG. 13, the third magnetic field generator 73 includes a coil conductor 73a, and two terminals 73b and 73c connected to opposite ends of the coil conductor 73a. The terminals 73b and 73c are each connected to the driving section 86 (see FIG. 2) of the correction processor 80.

The coil conductor 73a is wound a plurality of turns in a flat spiral shape along the XY plane of the reference coordinate system in such a manner as to be wound counterclockwise from the terminal 73b to the terminal 73c as viewed from above. The coil conductor 73a surrounds the first to third magnetic sensors 10, 20 and 30 as viewed from above. The coil conductor 73a has a square or almost square shape as a whole.

If a current is passed in the direction from the terminal 73b to the terminal 73c, the direction of the third additional magnetic field component applied to each of the first to third magnetic sensors 10, 20 and 30 becomes the Z direction of the reference coordinate system. If the direction of the current in the above example is reversed, the direction of the third additional magnetic field component becomes the −Z direction of the reference coordinate system.

Reference is now made to FIG. 2 to describe the operation of the correction processing section 84 of the correction processor 80. To begin with, an overview of the correction processing to be performed by the correction processing section 84 will be described.

An ideal state is defined here by the following first to third requirements. The first requirement is that the first sensing direction must coincide with a direction parallel to the first direction, the second sensing direction must coincide with a direction parallel to the second direction, and the third sensing direction must coincide with a direction parallel to the third direction.

The second requirement is that the ratio of a change in the first detection signal to a change in the first external magnetic field component, the ratio of a change in the second detection signal to a change in the second external magnetic field component, and the ratio of a change in the third detection signal to a change in the third external magnetic field component must be equal.

The third requirement is that the ratio of a change in the second detection signal to a change in the first external magnetic field component, the ratio of a change in the third detection signal to a change in the first external magnetic field component, the ratio of a change in the first detection signal to a change in the second external magnetic field component, the ratio of a change in the third detection signal to a change in the second external magnetic field component, the ratio of a change in the first detection signal to a change in the third external magnetic field component, and the ratio of a change in the second detection signal to a change in the third external magnetic field component must all be zero.

The first detection signal in the ideal state will be referred to as a first ideal signal. The second detection signal in the ideal state will be referred to as a second ideal signal. The third detection signal in the ideal state will be referred to as a third ideal signal. The correction processing is processing to correct the first to third detection signals and thereby generate the first to third corrected signals so that the first to third corrected signals are closer to the first to third ideal signals, compared to the first to third detection signals before correction.

Details of the correction processing will be described below. In the following description, the first detection signal is denoted by the symbol Sx, the second detection signal by the symbol Sy, and the third detection signal by the symbol Sz. The first corrected signal is denoted by the symbol CSx, the second corrected signal by the symbol CSy, and the third corrected signal by the symbol CSz. The first to third corrected signals CSz, CSy, and CSz are expressed in the following Eqs. (1) to (3), respectively.

$$CSx = C_{11}Sx + C_{12}Sy + C_{13}Sz \quad (1)$$

$$CSy = C_{21}Sx + C_{22}Sy + C_{23}Sz \quad (2)$$

$$CSz = C_{31}Sx + C_{32}Sy + C_{33}Sz \quad (3)$$

In Eqs. (1) to (3), each of $C_{11}$, $C_{12}$, $C_{13}$, $C_{21}$, $C_{22}$, $C_{23}$, $C_{31}$, $C_{32}$, and $C_{33}$ represents a correction coefficient. Eqs. (1) to (3) represent the correction functions in the present embodiment.

A 3×3 matrix with the correction coefficients $C_{ij}$ as its elements (i, j) will be referred to as a correction matrix MC, where each of i and j is an integer greater than or equal to 1 and not greater than 3. A column vector including the first to third detection signals Sx, Sy, and Sz as its elements will be referred to as a detection signal vector VS. A column vector including the first to third corrected signals CSx, CSy, and CSz as its elements will be referred to as a corrected signal vector VCS. The correction functions are expressed in Eq. (4) below using MC, VS, and VCS.

$$VCS=MC*VS \qquad (4)$$

In Eq. (4), VS=$[Sx, Sy, Sz]^T$, and VCS=$[CSx, CSy, CSz]^T$.

The correction processing section 84 performs the correction processing using the first to third detection signals Sx, Sy, and Sz converted into digital form by the A/D converters 81 to 83, and the correction functions expressed in Eqs. (1) to (3) or Eq. (4). The correction processing section 84 outputs the first to third corrected signals CSx, CSy and CSz generated by the correction processing to the host processor 200.

Next, the operations of the correction function determination section 85, the driving section 86 and the control section 87 of the correction processor 80 will be described. As mentioned previously, the control section 87 controls the correction function determination section 85 and the driving section 86 so that the correction function determination processing is performed.

Figure 14:
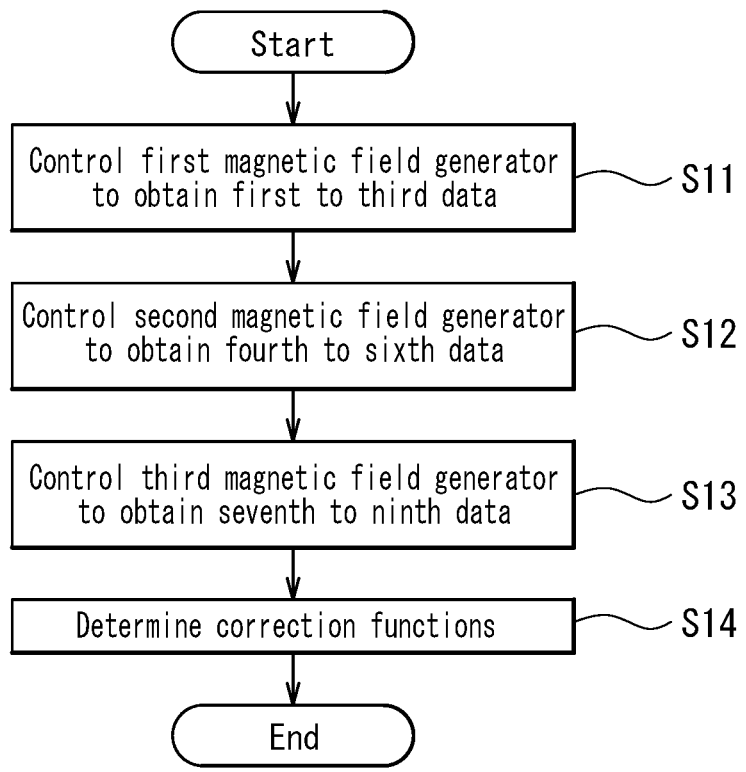
FIG. 14 is a flowchart of correction function determination processing of the first embodiment of the invention.

To begin with, an overview of the correction function determination processing will be provided with reference to FIG. 14. FIG. 14 is a flowchart of the correction function determination processing. In the correction function determination processing, first, at step S11, the driving section 86 controls the first magnetic field generator 71 to generate the first additional magnetic field and to change the first additional magnetic field. The correction function determination section 85 then obtains first to third data concerning respective changes in the first to third detection signals Sx, Sy, and Sz when the first additional magnetic field is thus changed. For example, the first additional magnetic field may be changed so that the first additional magnetic field component in the X direction and that in the −X direction are applied at different times to each of the first to third magnetic sensors 10, 20, and 30.

Next, at step S12, the driving section 86 controls the second magnetic field generator 72 to generate the second additional magnetic field and to change the second additional magnetic field. The correction function determination section 85 then obtains fourth to sixth data concerning respective changes in the first to third detection signals Sx, Sy, and Sz when the second additional magnetic field is thus changed. For example, the second additional magnetic field may be changed so that the second additional magnetic field component in the Y direction and that in the −Y direction are applied at different times to each of the first to third magnetic sensors 10, 20, and 30.

Next, at step S13, the driving section 86 controls the third magnetic field generator 73 to generate the third additional magnetic field and to change the third additional magnetic field. The correction function determination section 85 then obtains seventh to ninth data concerning respective changes in the first to third detection signals Sx, Sy, and Sz when the third additional magnetic field is thus changed. For example, the third additional magnetic field may be changed so that the third additional magnetic field component in the Z direction and that in the −Z direction are applied at different times to each of the first to third magnetic sensors 10, 20, and 30.

Then, at step S14, the correction function determination section 85 determines the correction functions on the basis of the obtained first to ninth data.

The amount of change in the first additional magnetic field component applied to each of the first to third magnetic sensors 10, 20 and 30 when the first additional magnetic field is changed at step S11 will be denoted by the symbol dHx. The amount of change in the second additional magnetic field component applied to each of the first to third magnetic sensors 10, 20 and 30 when the second additional magnetic field is changed at step S12 will be denoted by the symbol dHy. The amount of change in the third additional magnetic field component applied to each of the first to third magnetic sensors 10, 20 and 30 when the third additional magnetic field is changed at step S13 will be denoted by the symbol dHz.

The amount of change in the first detection signal Sx when the first additional magnetic field is changed at step S11 will be referred to as a first signal change amount, and denoted by the symbol dSxhx. The amount of change in the second detection signal Sy when the first additional magnetic field is changed at step S11 will be referred to as a second signal change amount, and denoted by the symbol dSyhx. The amount of change in the third detection signal Sz when the first additional magnetic field is changed at step S11 will be referred to as a third signal change amount, and denoted by the symbol dSzhx. The first to third signal change amounts dSxhx, dSyhx, and dSzhx correspond to the first to third data, respectively.

The amount of change in the first detection signal Sx when the second additional magnetic field is changed at step S12 will be referred to as a fourth signal change amount, and denoted by the symbol dSxhy. The amount of change in the second detection signal Sy when the second additional magnetic field is changed at step S12 will be referred to as a fifth signal change amount, and denoted by the symbol dSyhy. The amount of change in the third detection signal Sz when the second additional magnetic field is changed at step S12 will be referred to as a sixth signal change amount, and denoted by the symbol dSzhy. The fourth to sixth signal change amounts dSxhy, dSyhy, and dSzhy correspond to the fourth to sixth data, respectively.

The amount of change in the first detection signal Sx when the third additional magnetic field is changed at step S13 will be referred to as a seventh signal change amount, and denoted by the symbol dSxhz. The amount of change in the second detection signal Sy when the third additional magnetic field is changed at step S13 will be referred to as an eighth signal change amount, and denoted by the symbol dSyhz. The amount of change in the third detection signal Sz when the third additional magnetic field is changed at step S13 will be referred to as a ninth signal change amount, and denoted by the symbol dSzhz. The seventh to ninth signal change amounts dSxhz, dSyhz, and dSzhz correspond to the seventh to ninth data, respectively.

A direction parallel to the first direction will be referred to as a first main-axis direction. The ratio of a change in the first detection signal Sx to a change in the strength of a magnetic field in the first main-axis direction will be referred to as a first main-axis sensitivity, and denoted by the symbol SSxhx. A direction parallel to the second direction will be referred to as a second main-axis direction. The ratio of a change in the second detection signal Sy to a change in the strength of a magnetic field in the second main-axis direction will be referred to as a second main-axis sensitivity, and denoted by the symbol SSyhy. A direction parallel to the third direction will be referred to as a third main-axis direction. The ratio of a change in the third detection signal Sz to a change in the strength of a magnetic field in the third main-axis direction will be referred to as a third main-axis sensitivity, and denoted by the symbol SSzhz.

The ratio of a change in the second detection signal Sy to a change in the strength of the magnetic field in the first main-axis direction will be referred to as a first cross-axis sensitivity, and denoted by the symbol SSyhx. The ratio of a change in the third detection signal Sz to a change in the strength of the magnetic field in the first main-axis direction will be referred to as a second cross-axis sensitivity, and denoted by the symbol SSzhx. The ratio of a change in the first detection signal Sx to a change in the strength of the magnetic field in the second main-axis direction will be referred to as a third cross-axis sensitivity, and denoted by the symbol SSxhy. The ratio of a change in the third detection signal Sz to a change in the strength of the magnetic field in the second main-axis direction will be referred to as a fourth cross-axis sensitivity, and denoted by the symbol SSzhy. The ratio of a change in the first detection signal Sx to a change in the strength of the magnetic field in the third main-axis direction will be referred to as a fifth cross-axis sensitivity, and denoted by the symbol SSxhz. The ratio of a change in the second detection signal Sy to a change in the strength of the magnetic field in the third main-axis direction will be referred to as a sixth cross-axis sensitivity, and denoted by the symbol SSyhz.

The first to third signal change amounts dSxhx, dSyhx, and dSzhx, i.e., the first to third data, are expressed in Eq. (5) below.

$$\begin{pmatrix} dSxhx \\ dSyhx \\ dSzhx \end{pmatrix} = \begin{pmatrix} SSxhx & SSxhy & SSxhz \\ SSyhx & SSyhy & SSyhz \\ SSzhx & SSzhy & SSzhz \end{pmatrix} \begin{pmatrix} dHx \\ 0 \\ 0 \end{pmatrix} \quad (5)$$

The fourth to sixth signal change amounts dSxhy, dSyhy, and dSzhy, i.e., the fourth to sixth data, are expressed in Eq. (6) below.

$$\begin{pmatrix} dSxhy \\ dSyhy \\ dSzhy \end{pmatrix} = \begin{pmatrix} SSxhx & SSxhy & SSxhz \\ SSyhx & SSyhy & SSyhz \\ SSzhx & SSzhy & SSzhz \end{pmatrix} \begin{pmatrix} 0 \\ dHy \\ 0 \end{pmatrix} \quad (6)$$

The seventh to ninth signal change amounts dSxhz, dSyhz, and dSzhz, i.e., the seventh to ninth data, are expressed in Eq. (7) below.

$$\begin{pmatrix} dSxhz \\ dSyhz \\ dSzhz \end{pmatrix} = \begin{pmatrix} SSxhx & SSxhy & SSxhz \\ SSyhx & SSyhy & SSyhz \\ SSzhx & SSzhy & SSzhz \end{pmatrix} \begin{pmatrix} 0 \\ 0 \\ dHz \end{pmatrix} \quad (7)$$

The 3×3 matrix on the right-hand side of each of Eqs. (5) to (7) will hereinafter be referred to as a sensitivity matrix, and denoted by the symbol MSS.

Next, how to determine the correction functions at step S14 will be specifically described. The correction function determination section 85 first computes the sensitivities SSxhx, SSyhx, SSzhx, SSxhy, SSyhy, SSzhy, SSxhz, SSyhz, and SSzhz on the basis of the first to ninth data, i.e., the first to ninth signal change amounts dSxhx, dSyhx, dSzhx, dSxhy, dSyhy, dSzhy, dSxhz, dSyhz, and dSzhz, the amount of change dHx in the first additional magnetic field component, the amount of change dHy in the second additional magnetic field component, and the amount of change dHz in the third additional magnetic field component.

From Eq. (5), SSxhx=dSxhx/dHx. SSyhx=dSyhx/dHx. SSzhx=dSzhx/dHx. From Eq. (6), SSxhy=dSxhy/dHy. SSyhy=dSyhy/dHy. SSzhy=dSzhy/dHy. From Eq. (7), SSxhz=dSxhz/dHz. SSyhz=dSyhz/dHz. SSzhz=dSzhz/dHz.

The correction function determination section 85 then determines the correction coefficient matrix MC by using the computed sensitivities SSxhx, SSyhx, SSzhx, SSxhy, SSyhy, SSzhy, SSxhz, SSyhz, and SSzhz. Here, a first example and a second example of the correction coefficient matrix MC will be described. In the first example, the correction coefficient matrix MC is an inverse matrix MSS$^{-1}$ of the sensitivity matrix MSS.

In the second example, the correction coefficient matrix MC is a matrix including approximate values to the elements (i, j) of the inverse matrix MSS$^{-1}$ as its elements (i, j). For example, the correction coefficient matrix MC of the second example is expressed in Eq. (8) below. In this example, the approximate values to the elements (i, j) of the inverse matrix MSS$^{-1}$ are determined by using the fact that the first to third main-axis sensitivities SSxhx, SSyhy, and SSzhz are close to each other in value and the first to sixth cross-axis sensitivities are close to zero in value.

$$MC = \begin{pmatrix} C_{11} & C_{12} & C_{13} \\ C_{21} & C_{22} & C_{23} \\ C_{31} & C_{32} & C_{33} \end{pmatrix} \quad (8)$$

$$= \begin{pmatrix} \dfrac{1}{SSxhx} & -SSxhy & -SSxhz \\ -SSyhx & \dfrac{1}{SSyhy} & -SSyhz \\ -SSzhx & -SSzhy & \dfrac{1}{SSzhz} \end{pmatrix}$$

The correction function determination section 85 then determines the correction functions on the basis of the determined correction coefficient matrix MC. As described above, the correction functions are expressed in Eqs. (1) to (3) or Eq. (4).

For example, the correction function determination processing may be executed if at least one of the following first to third activation requirements is satisfied.

The first activation requirement is that a predetermined period of time must have elapsed since the last correction function determination processing. The correction processor 80 may include a timer (not shown) for notifying the control section 87 that the predetermined period of time has elapsed.

The second activation requirement is that any of the first to third detection signals Sx, Sy, and Sz must have a value in a nonlinear region. Now, linear and nonlinear regions will be described by using the first detection signal Sx as an example. In a graph representing a relationship between the first external magnetic field component and the first detection signal Sx, a point where the strength of the first external magnetic field component corresponds to 0 will be referred to as a point of origin. The range of the first detection signal Sx includes a linear region and first and second nonlinear regions. The linear region is a region including the point of origin. In the linear region, the ratio of a change in the first detection signal Sx to a change in the first external magnetic field component, i.e., the first main-axis sensitivity SSxhx is constant or almost constant. The first and second nonlinear regions are regions where the first main-axis sensitivity SSxhx is different from that in the linear region. The first and second nonlinear regions are on both sides of the linear region. The linear region and the first and second nonlinear regions are determined in advance. The first main-axis sensitivity SSxhx in each of the first and second nonlinear regions can change with changes in the first external magnetic field component.

Similarly, the ranges of the second and third detection signals Sy and Sz each include a linear region and first and second nonlinear regions. The correction processor 80 may include a determination section for determining whether any of the first to third detection signals Sx, Sy, and Sz has a value in the first or second nonlinear region. If any of the first to third detection signals Sx, Sy, and Sz has a value in the first or second nonlinear region, the second activation requirement is satisfied. In such a case, the determination section outputs a notifying signal to the control section 87.

The third activation requirement is that any of the first to third detection signals Sx, Sy, and Sz must have a value outside a use range defined in advance. An example of the use range is the range of normal input signals to the A/D converters 81, 82, and 83. In this example, the third activation requirement is satisfied if input of a signal outside the use range to any of the A/D converters 81, 82, and 83 is detected. In such a case, the A/D converter 81, 82, or 83 outputs a notifying signal to the control section 87.

Figure 15:
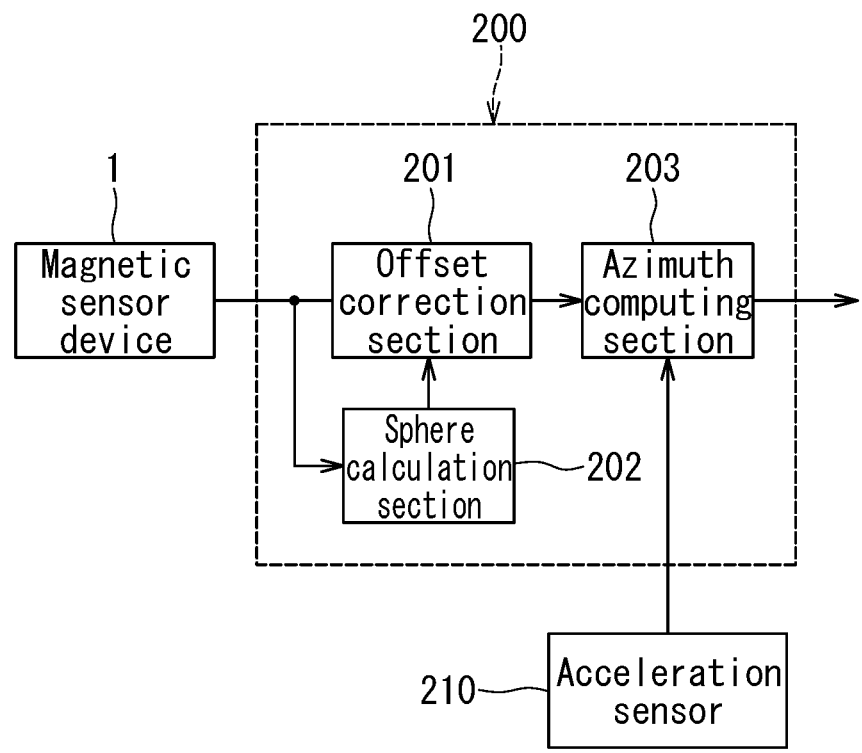
FIG. 15 is a functional block diagram showing an example configuration of a host processor shown in FIG. 2.

Next, an example configuration of the host processor 200 shown in FIG. 2 will be described with reference to FIG. 15. For example, the host processor 200 is constructed of a microcomputer. FIG. 15 shows an example of configuration of the host processor 200 for the case where the magnetic sensor device 1 is used as a geomagnetic sensor device. In the example shown in FIG. 15, the host processor 200 includes an offset correction section 201, a sphere calculation section 202, and an azimuth computing section 203. The offset correction section 201, the sphere calculation section 202 and the azimuth computing section 203 are functional blocks for performing the following processing.

The offset correction section 201 receives the first to third corrected signals CSx, CSy, and CSz generated by the correction processing at the correction processing section 84 (FIG. 2) of the correction processor 80. If an offset occurs in the first to third detection signals Sx, Sy, and Sz due to factors other than the magnetic field to be detected, i.e., the geomagnetism, the offset correction section 201 performs offset correction processing on the first to third corrected signals CSx, CSy, and CSz to remove the effect of the offset.

Assume here an orthogonal coordinate system defined by mutually orthogonal X-, Y-, and Z-axes, and define a point by using the first to third corrected signals CSx, CSy and CSz corresponding to a set of first to third detection signals Sx, Sy and Sz at some point in time as the X, Y, and Z coordinates, respectively. Such a point will be referred to as a measurement point. If a plurality of measurement points are taken with the orientation and position of the electronic apparatus incorporating the magnetic sensor device 1 varied in a random fashion and the measurement points are plotted on the foregoing orthogonal coordinate system, the measurement points are distributed over the spherical surface of an imaginary sphere with a point (cx, cy, cz) as its center point. The radius of the imaginary sphere has a correspondence with the magnitude of the geomagnetism. The center point of the imaginary sphere represents an offset resulting from some factor other than the geomagnetism. An example of the offset correction processing may be processing to convert the measurement point (CSx, CSy, CSz) into a point (CSx−cx, CSy−cy, CSz−cz) so that the coordinates of the center point come to the point of origin (0, 0, 0) of the orthogonal coordinate system.

Specifically, the offset correction section 201 generates a difference between the first corrected signal CSx and cx as a fourth corrected signal, generates a difference between the second corrected signal CSy and cy as a fifth corrected signal, and generates a difference between the third corrected signal CSz and cz as a sixth corrected signal. The offset correction section 201 outputs the generated fourth to sixth corrected signals to the azimuth computing section 203.

The sphere calculation section 202 calculates the center point (cx, cy, cz) on the basis of the plurality of measurement points (CSx, CSy, CSz). The sphere calculation section 202 outputs the calculated cx, cy, and cz to the offset correction section 201.

The azimuth computing section 203 computes an azimuth on the basis of the fourth to sixth corrected signals. For example, if the electronic apparatus incorporating the magnetic sensor device 1 is one that always maintains an orientation such that the −Z direction of the reference coordinate system coincides with the direction of the acceleration of gravity, the azimuth computing section 203 may compute the azimuth by using only the fourth and fifth corrected signals.

For example, if the electronic apparatus incorporating the magnetic sensor device 1 is such one that the −Z direction of the reference coordinate system can form a varying tilt angle with respect to the direction of the acceleration of gravity, the azimuth computing section 203 may compute the azimuth by using the fourth to sixth corrected signals and measurement information from an acceleration sensor 210 shown in FIG. 15. The acceleration sensor 210 is a sensor for measuring acceleration in three mutually orthogonal directions, and is incorporated in the electronic apparatus. The measurement information from the acceleration sensor 210 includes measurement values of acceleration in the three mutually orthogonal directions.

The effect of the magnetic sensor device 1 according to the present embodiment will now be described. In the magnetic sensor device 1 according to the present embodiment, the first to third magnetic field generators 71 to 73 used for measurements of the main- and cross-axis sensitivities of the first to third magnetic sensors 10, 20, and 30 are integrated with the first to third magnetic sensors 10, 20, and 30. According to the present embodiment, it is thus possible to perform measurements of the main- and cross-axis sensitivities of the first to third magnetic sensors 10, 20, and 30 and to correct the first to third detection signals Sx, Sy, and Sz on the basis of the measurement results easily regardless of the environment of use of the magnetic sensor device 1.

In the present embodiment, the correction processor 80 is integrated with the first to third magnetic sensors 10, 20 and 30 and the first to third magnetic field generators 71 to 73. According to the present embodiment, it is thus possible for the magnetic sensor device 1 in the form of a single electronic component to accomplish the aforementioned measurements of the main- and cross-axis sensitivities and corrections to the first to third detection signals Sx, Sy, and Sz based on the measurement results.

When the first to third corrected signals CSx, CSy, and CSz are generated by correcting the first to third detection signals Sx, Sy, and Sz by the correction processing, an offset can occur in the first to third corrected signals CSx, CSy, and CSz due to some reason such as nonlinearity of the first to third detection signals Sx, Sy, and Sz. However, the effect of the offset associated with the correction processing can be removed by the offset correction processing at the offset correction section 201, along with the effect of offsets occurring due to other reasons.

If at least one of the correction coefficients $C_{11}$, $C_{22}$, and $C_{33}$ varies greatly before and after the update of the correction functions, the corrected signals corresponding to the same detection signals can change greatly in value. To prevent this, for example, the following Eqs. (9) to (11) may be used as the updated correction functions instead of Eqs. (1) to (3).

$$CSx = C_{11}(Sx - Sx1) + CSx1 + C_{12}Sy + C_{13}Sz \tag{9}$$

$$CSy = C_{21}Sx + C_{22}(Sy - Sy1) + CSy1 + C_{23}Sz \tag{10}$$

$$CSz = C_{31}Sx + C_{32}Sy + C_{33}(Sz - Sz1) + CSz1 \tag{11}$$

In Eqs. (9) to (11), Sx1, Sy1 and Sz1 respectively represent the values of the first to third detection signals Sx, Sy and Sz generated at some point in time before the current execution of the correction function determination processing. CSx1, CSy1 and CSz1 respectively represent the values of the first to third corrected signals CSx, CSy, and CSz calculated by using Sx1, Sy1 and Sz1 and the pre-update correction functions.

If Eqs. (9) to (11) are used as the correction functions, an offset can occur in the first to third corrected signals CSx, CSy and CSz. However, the offset can be removed by the offset correction processing at the offset correction section 201, along with the effect of offsets occurring due to other reasons.

Second Embodiment

A second embodiment of the invention will now be described. A magnetic sensor device 301 according to the present embodiment has a configuration different from that in the first embodiment. How the configuration differs will be described first briefly. The magnetic sensor device 301 according to the present embodiment is provided with two of the first to third magnetic sensors 10, 20 and 30 of the first embodiment. The following description deals with an example in which the magnetic sensor device 301 is provided with the first magnetic sensor 10 and the second magnetic sensor 20 as the aforementioned two magnetic sensors.

Figure 16:
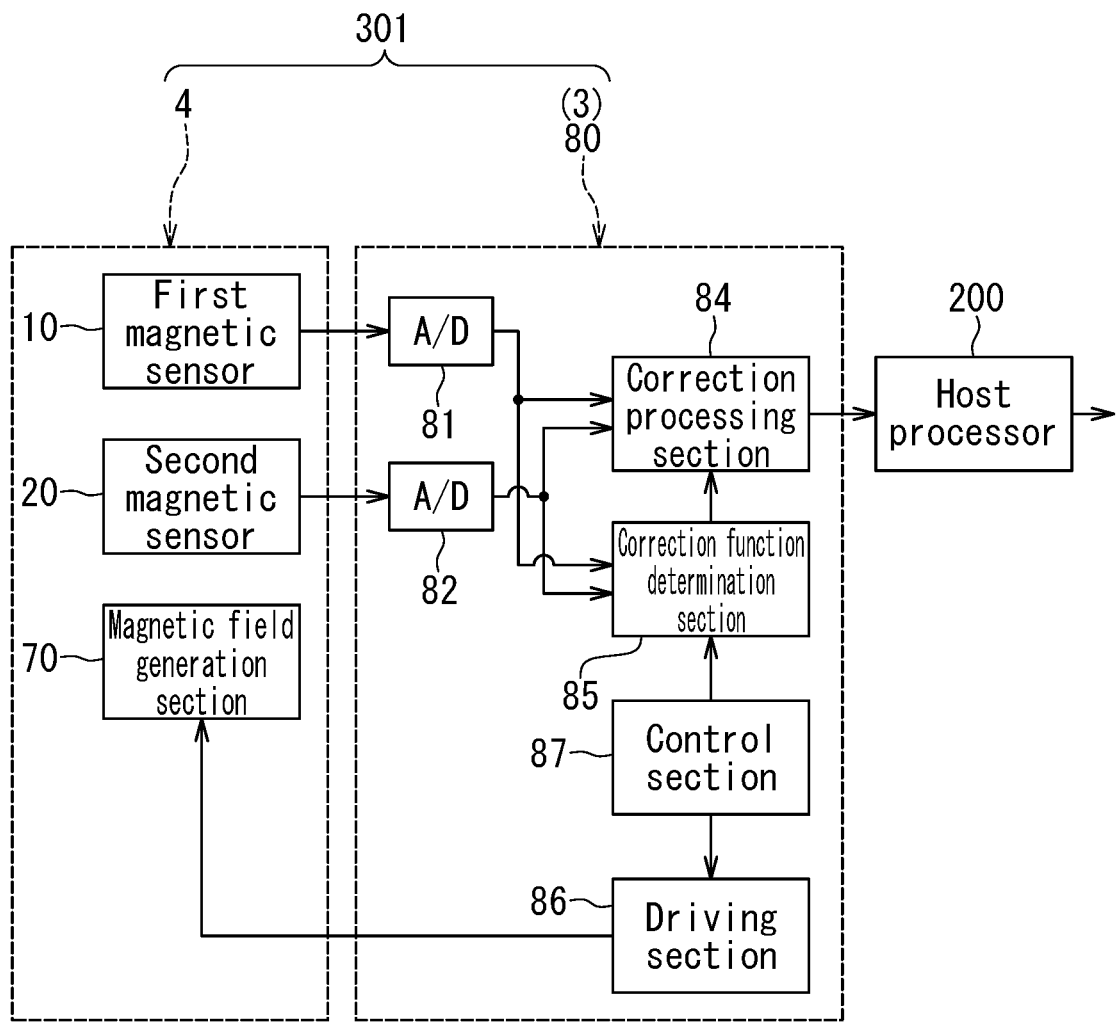
FIG. 16 is a functional block diagram showing a configuration of a magnetic sensor device according to a second embodiment of the invention.

FIG. 16 shows the configuration of the magnetic sensor device 301 according to the present embodiment. The present embodiment is provided with neither of the third magnetic sensor 30 and the A/D converter 83. The magnetic field generation section 70 includes the first and second magnetic field generators 71 and 72 (FIGS. 11 and 12), and does not include the third magnetic field generator 73.

Next, a description will be given of the correction processing in the present embodiment, that is, the operation of the correction processing section 84 of the correction processor 80 in the present embodiment. The first magnetic sensor 10 generates a first detection signal Sx, and the second magnetic sensor 20 generates a second detection signal Sy. The correction processing in the present embodiment is processing to correct the first and second detection signals Sx and Sy to generate first and second corrected signals CSx and CSy so that the first and second corrected signals CSx and CSy are closer to the first and second ideal signals described in relation to the first embodiment, compared to the first and second detection signals Sx and Sy before correction.

The first and second corrected signals CSx and CSy in the present embodiment are expressed in Eqs. (12) and (13) below, respectively.

$$CSx = C_{11}Sx + C_{12}Sy \tag{12}$$

$$CSy = C_{21}Sx + C_{22}Sy \tag{13}$$

In Eqs. (12) and (13), each of $C_{11}$, $C_{12}$, $C_{21}$, and $C_{22}$ represents a correction coefficient. Eqs. (12) and (13) represent the correction functions in the present embodiment.

Like the first embodiment, the correction functions are expressed in Eq. (4) of the first embodiment by using a correction coefficient matrix MC, a detection signal vector VS, and a corrected signal vector VCS. In the present embodiment, the correction coefficient matrix MC is a 2×2 matrix including correction coefficients $C_{ij}$ as its elements (i, j), where each of i and j is 1 or 2. $VS = [Sx, Sy]^T$, and $VCS = [CSx, CSy]^T$.

In the present embodiment, the correction processing section 84 performs the correction processing using the first and second detection signals Sx and Sy converted into digital form by the A/D converters 81 and 82, and the correction functions expressed in Eqs. (12) and (13), or Eq. (4). The correction processing section 84 outputs the first and second corrected signals CSx and CSy generated by the correction processing to the host processor 200.

Next, the correction function determination processing in the present embodiment, that is, the operations of the correction function determination section 85, the driving section 86 and the control section 87 of the correction processor 80 in the present embodiment will be described.

Figure 17:
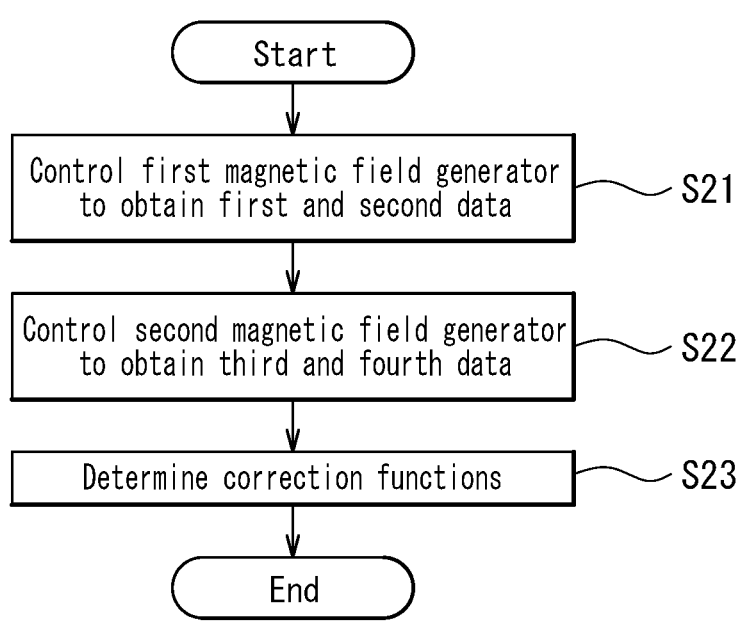
FIG. 17 is a flowchart of correction function determination processing of the second embodiment of the invention.

To begin with, an overview of the correction function determination processing in the present embodiment will be provided with reference to FIG. 17. FIG. 17 is a flowchart of the correction function determination processing. In the correction function determination processing, first, at step S21, the driving section 86 controls the first magnetic field generator 71 to generate the first additional magnetic field and to change the first additional magnetic field. The correction function determination section 85 then obtains first data and second data concerning respective changes in the first detection signal Sx of the first magnetic sensor 10 and the second detection signal Sy of the second magnetic sensor 20 when the first additional magnetic field is thus changed.

Next, at step S22, the driving section 86 controls the second magnetic field generator 72 to generate the second additional magnetic field and to change the second additional magnetic field. The correction function determination section 85 then obtains third and fourth data concerning respective changes in the first and second detection signals Sx and Sy when the second additional magnetic field is thus changed.

Then, at step S23, the correction function determination section 85 determines the correction functions on the basis of the obtained first to fourth data.

Here, the signal change amounts dSxhx, dSyhx, dSxhy, and dSyhy are defined similarly to the first embodiment. The signal change amounts dSxhx, dSyhx, dSxhy, and dSyhy correspond to the first to fourth data in the present embodiment, respectively.

The signal change amounts dSxhx and dSyhx, i.e., the first and second data, are expressed in Eq. (14) below.

$$\begin{pmatrix} dSxhx \\ dSyhx \end{pmatrix} = \begin{pmatrix} SSxhx & SSxhy \\ SSyhx & SSyhy \end{pmatrix} \begin{pmatrix} dHx \\ 0 \end{pmatrix} \tag{14}$$

The signal change amounts dSxhy and dSyhy, i.e., the third and fourth data, are expressed in Eq. (15) below.

$$\begin{pmatrix} dSxhy \\ dSyhy \end{pmatrix} = \begin{pmatrix} SSxhx & SSxhy \\ SSyhx & SSyhy \end{pmatrix} \begin{pmatrix} 0 \\ dHy \end{pmatrix} \quad (15)$$

The definitions of SSxhx, SSxhy, SSyhx, SSyhy, dHx, and dHy in Eqs. (14) and (15) are the same as in the first embodiment. The 2×2 matrix on the right-hand side of each of Eqs. (14) and (15) is a sensitivity matrix MSS in the present embodiment.

Next, how to determine the correction functions at step S23 will be specifically described. The correction function determination section 85 first computes the sensitivities SSxhx, SSyhx, SSxhy, and SSyhy on the basis of the first to fourth data, i.e., the signal change amounts dSxhx, dSyhx, dSxhy, and dSyhy, the amount of change dHx in the first additional magnetic field component, and the amount of change dHy in the second additional magnetic field component. The method for computing the sensitivities SSxhx, SSyhx, SSxhy, and SSyhy is the same as in the first embodiment.

The correction function determination section 85 then determines the correction coefficient matrix MC by using the computed sensitivities SSxhx, SSyhx, SSxhy, and SSyhy. Here, a first example and a second example of the correction coefficient matrix MC in the present embodiment will be described. In the first example, the correction coefficient matrix MC is an inverse matrix $MSS^{-1}$ of the sensitivity matrix MSS.

In the second example, the correction coefficient matrix MC is a matrix including approximate values to the elements (i, j) of the inverse matrix $MSS^{-1}$ as its elements (i, j). For example, the correction coefficient matrix MC of the second example is expressed in Eq. (16) below.

$$MC = \begin{pmatrix} C_{11} & C_{12} \\ C_{21} & C_{22} \end{pmatrix} = \begin{pmatrix} \frac{1}{SSxhx} & -SSxhy \\ -SSyhx & \frac{1}{SSyhy} \end{pmatrix} \quad (16)$$

The correction function determination section 85 then determines the correction functions on the basis of the determined correction coefficient matrix MC.

In the magnetic sensor device 301 according to the present embodiment, the first and second magnetic field generators 71 and 72 used for measurements of the main- and cross-axis sensitivities of the first and second magnetic sensors 10 and 20 are integrated with the first and second magnetic sensors 10 and 20. According to the present embodiment, it is thus possible to perform measurements of the main- and cross-axis sensitivities of the first and second magnetic sensors 10 and 20 and to correct the first and second detection signals Sx and Sy on the basis of the measurement results easily regardless of the environment of use of the magnetic sensor device 301.

The configuration, operation and effects of the present embodiment are otherwise the same as those of the first embodiment.

The present invention is not limited to the foregoing embodiments, and various modifications may be made thereto. For example, the configurations of the first to third magnetic sensors 10, 20 and 30 and those of the first to third magnetic field generators 71, 72 and 73 are not limited to the respective examples illustrated in the foregoing embodiments, and can be freely chosen as long as the requirements of the claims are met.

The magnetic sensor device 301 according to the second embodiment may be provided with the first and third magnetic sensors 10 and 30, or with the second and third magnetic sensors 20 and 30 instead of the first and second magnetic sensors 10 and 20, as its two magnetic sensors.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor device comprising:
   a first magnetic sensor for generating a first detection signal having a correspondence with a first external magnetic field component, the first external magnetic field component being a component of an external magnetic field and being in a first sensing direction;
   a second magnetic sensor for generating a second detection signal having a correspondence with a second external magnetic field component, the second external magnetic field component being a component of the external magnetic field and being in a second sensing direction;
   a third magnetic sensor for generating a third detection signal having a correspondence with a third external magnetic field component, the third external magnetic field component being a component of the external magnetic field and being in a third sensing direction;
   a first magnetic field generator capable of generating a first additional magnetic field;
   a second magnetic field generator capable of generating a second additional magnetic field;
   a third magnetic field generator capable of generating a third additional magnetic field; and
   a correction processor for controlling the first to third magnetic field generators and correcting the first to third detection signals, wherein
   the first to third magnetic sensors and the first to third magnetic field generators are integrated,
   the first to third magnetic sensors are each configured to be subjected to:
     a first additional magnetic field component when the first additional magnetic field is generated by the first magnetic field generator, the first additional magnetic field component being a component of the first additional magnetic field and being in a direction parallel to a first direction;
     a second additional magnetic field component when the second additional magnetic field is generated by the second magnetic field generator, the second additional magnetic field component being a component of the second additional magnetic field and being in a direction parallel to a second direction; and
     a third additional magnetic field component when the third additional magnetic field is generated by the third magnetic field generator, the third additional magnetic field component being a component of the third additional magnetic field and being in a direction parallel to a third direction,
   the correction processor performs correction function determination processing to determine correction functions for correcting the first to third detection signals, and correction processing to correct the first to third detection signals by using the first to third detection signals and the correction functions, and the correction function determination processing is processing to obtain: first to third data concerning respective changes in the first to third detection signals when the first magnetic field generator is controlled to change the first additional magnetic field; fourth to sixth data concerning respective changes in the first to third detection signals when the second magnetic field generator is controlled to change the second additional magnetic field; and seventh to ninth data concerning respective changes in the first to third detection signals when the third magnetic field generator is controlled to change the third additional magnetic field, and to determine the correction functions on the basis of the first to ninth data.

2. The magnetic sensor device according to claim 1, wherein the first to third directions are orthogonal to each other.

3. The magnetic sensor device according to claim 1, wherein the correction processor is integrated with the first to third magnetic sensors and the first to third magnetic field generators.

4. A magnetic sensor device comprising:
- a first magnetic sensor for generating a first detection signal having a correspondence with a first external magnetic field component, the first external magnetic field component being a component of an external magnetic field and being in a first sensing direction;
- a second magnetic sensor for generating a second detection signal having a correspondence with a second external magnetic field component, the second external magnetic field component being a component of the external magnetic field and being in a second sensing direction;
- a first magnetic field generator capable of generating a first additional magnetic field;
- a second magnetic field generator capable of generating a second additional magnetic field; and
- a correction processor for controlling the first and second magnetic field generators and correcting the first and second detection signals, wherein the first and second magnetic sensors and the first and second magnetic field generators are integrated, the first and second magnetic sensors are each configured to be subjected to:
- a first additional magnetic field component when the first additional magnetic field is generated by the first magnetic field generator, the first additional magnetic field component being a component of the first additional magnetic field and being in a direction parallel to a first direction; and
- a second additional magnetic field component when the second additional magnetic field is generated by the second magnetic field generator, the second additional magnetic field component being a component of the second additional magnetic field and being in a direction parallel to a second direction, the correction processor performs correction function determination processing to determine correction functions for correcting the first and second detection signals, and correction processing to correct the first and second detection signals by using the first and second detection signals and the correction functions, and the correction function determination processing is processing to obtain: first and second data concerning respective changes in the first and second detection signals when the first magnetic field generator is controlled to change the first additional magnetic field; and third and fourth data concerning respective changes in the first and second detection signals when the second magnetic field generator is controlled to change the second additional magnetic field, and to determine the correction functions on the basis of the first to fourth data.

5. The magnetic sensor device according to claim 4, wherein the first and second directions are orthogonal to each other.

6. The magnetic sensor device according to claim 4, wherein the correction processor is integrated with the first and second magnetic sensors and the first and second magnetic field generators.

* * * * *